(12) United States Patent
Rastegar

(10) Patent No.: US 11,538,975 B2
(45) Date of Patent: Dec. 27, 2022

(54) THERMODYNAMIC SYSTEMS FOR EFFICIENTLY HARVESTING HEAT TO GENERATE ELECTRICAL ENERGY

(71) Applicant: Omnitek Partners LLC, Ronkonkoma, NY (US)

(72) Inventor: Jahangir S Rastegar, Stony Brook, NY (US)

(73) Assignee: OMNITEK PARTNERS LLC, Ronkonkoma, NY (US)

( * ) Notice: Subject to any disclaimer, the term of this patent is extended or adjusted under 35 U.S.C. 154(b) by 0 days.

(21) Appl. No.: 17/324,950

(22) Filed: May 19, 2021

(65) Prior Publication Data

US 2021/0367127 A1 Nov. 25, 2021

Related U.S. Application Data

(60) Provisional application No. 63/027,236, filed on May 19, 2020.

(51) Int. Cl.
*H01L 35/30* (2006.01)
*H01L 35/32* (2006.01)

(52) U.S. Cl.
CPC ............. *H01L 35/30* (2013.01); *H01L 35/32* (2013.01)

(58) Field of Classification Search
CPC ............ H01L 35/30; H01L 35/32; F28F 13/00
See application file for complete search history.

(56) References Cited

U.S. PATENT DOCUMENTS

2013/0180563 A1* 7/2013 Makansi ................ H01L 35/06
320/101

FOREIGN PATENT DOCUMENTS

FR 3025362 A1 * 3/2016 ............. H01L 35/30

OTHER PUBLICATIONS

FR-3025362-A1, Machine Translation (Year: 2016).*

* cited by examiner

*Primary Examiner* — Devina Pillay

(57) ABSTRACT

A thermoelectric generator system including: a first surface having a first material configured to undergo a phase change at a first temperature; an actuator configured to retract the first material from contacting a heat source upon the heat source reaching a predetermined temperature higher than the first temperature; and a thermoelectric generator having a hot side and a cold side, the first material being on the hot side. The thermoelectric generator system can further include a second material configured to undergo a phase change at a second temperature, the second temperature being lower than the first temperature, the second material being on the cold side of the thermoelectric generator.

12 Claims, 28 Drawing Sheets

Thermoelectric Generator System (TEGS)

THERMODYNAMIC SYSTEMS FOR EFFICIENTLY HARVESTING HEAT TO GENERATE ELECTRICAL ENERGY

CROSS-REFERENCE TO RELATED APPLICATION

This application claims the benefit to U.S. Provisional Application No. 63/027,236, filed on May 19, 2020, the entire contents thereof is incorporated herein by reference.

BACKGROUND

1. Field

The present invention relates generally to electrical generators, and more particularly to highly efficient thermoelectric based systems for harvesting heat energy and converting it to electrical energy.

2. Prior Art

Current thermoelectric generators (TEG) are solid-state semiconductor devices that turn heat flow due to a temperature difference into a DC voltage and thereby a DC power source. Thermoelectric generator semiconductor devices utilize the Seebeck effect to generate voltage. This generated voltage drives electrical current and produces useful power at a load.

The basic building block of a thermoelectric generator is a thermocouple as shown in FIG. 1. A thermocouple (also called unicouple) is made up of one p-type semiconductor and one n-type semiconductor. The semiconductors are connected by a metal strip that connects them electrically in series as shown in FIG. 1. The semiconductors are also known as thermoelements, dice, pellets.

The Seebeck effect is a direct energy conversion of heat into a voltage potential. The Seebeck effect occurs due to the movement of charge carriers within the semiconductors. In doped n-type semiconductors, charge carriers are electrons and in doped p-type semiconductors, charge carriers are holes. Charge carriers diffuse away from the hot side of the semiconductor. This diffusion leads to a buildup of charge carriers at one end. This buildup of charge creates a voltage potential that is directly proportional to the temperature difference across the semiconductor, FIG. 2.

To create a thermoelectric generator module, FIG. 3, many p-type and n-type couples are connected electrically in series and/or parallel to create the desired electrical current and voltage. The couples are usually placed between two parallel ceramic plates. The plates provide structural rigidity, a flat surface for mounting and a dielectric layer to prevent electrical short circuits.

Three materials are currently used for thermoelectric generators. These materials are bismuth (Bi2Te3) telluride, lead telluride (PbTe), Silicon germanium (SiGe), and calcium manganese oxide (Ca2Mn3O8). The material used is dependent on the characteristics of the heat source, cold sink and the design of the thermoelectric generator. Many thermoelectric generator materials are currently undergoing research and promise higher temperature operation and higher performance than those currently used commercially.

The usefulness of a material in thermoelectric systems is determined by its efficiency, which is determined by the material's electrical conductivity, thermal conductivity and Seebeck coefficient. The Seebeck coefficient is temperature dependent. The maximum efficiency of a thermoelectric material is determined by its thermoelectric figure-of-merit. The maximum efficiency of the energy conversion process at a given point in the material is determined by the thermoelectric materials figure-of-merit zT, given by:

$$zT = \frac{\sigma S^2 T}{\kappa}$$

where, S is the Seebeck coefficient, K is thermal conductivity, σ electrical conductivity, and T the temperature.

The efficiency of a thermoelectric system (device) for electricity generation is given by η, defined as:

$$\eta = \frac{\text{energy provided to the load}}{\text{heat energy absorbed at the hot junction}}$$

The maximum efficiency of a thermoelectric system is typically described in terms of in terms of the figure-of-merit ZT (Snyder, G. J. (2017). "Figure of merit ZT of a thermoelectric device defined from materials properties". *Energy and Environmental Science*. 10 (11): 2280-2283). The typical efficiency of TEGs is around 5% to 12%. The same shows the historical improvements in the value of ZT for some of the common materials used in TEGs. More recent thermoelectric generator systems use highly doped semiconductors made from bismuth telluride (Bi2Te3), lead telluride (PbTe), calcium manganese oxide (Ca2Mn3O8), or combinations thereof, depending on the maximum operating temperature.

Thermoelectric materials have undergone considerable structure-property analysis to suitably control ZT (for example, He, J and Tritt, T, "Advances in thermoelectric materials research: Looking back and moving forward," Science (2017) (357) 1-9 and Poon, J, "Recent advances in thermoelectric performance of half-heusler compounds," Metals (2018) 8(899), 1-10). These studies aim to create materials with low lattice thermal conductivity to maintain thermal gradients and a high electrical conductivity (power factor). The materials studied vary considerably from semiconductors, ceramics, semimetals and polymers. These studies also include, crystallinity varying from polycrystalline, single crystals to nanocomposites as well and extend to geometries varying from bulk, thin film, wire and nano clusters. Phonon scattering strategies at interfaces aim to lower thermal conduction while only minimally causing electron scattering and minor reduction in electron conductivity. Other approaches employ heavy metal substitutions favoring lower thermal vibration. Stoichiometric control of inorganic compounds and semiconductor heavy doping to control appropriate levels of majority carrier conductivity are two other major materials strategies to optimize the power factor.

Strategies to raise ZT through reduction in lattice thermal conductivity involve phonon scattering: (i) mass fluctuation scattering incorporating mixed phase microstructures (ii) grain boundary scattering by grain size control and (iii) interface scattering in multilayer systems such as thin films (for example, Mildred, S, Dresselhaus, et. al, New Directions for Low dimensional Thermoelectric Materials, Advanced Materials, 2007, pages 1043-1053). Other approaches employ solid solution alloying of large unit cell systems with heavy metals with low spring coefficients. Skutterdites, clathrates and Zintl phases such as Yb14MnSb11 (which contain both covalent and ionic atoms) have provided many opportunities to engineer reduced thermal conductivity through exploiting random vacancy scattering sites, partial atomic occupancy and interstitial sites (e.g., Wood, C., Reports of Progress in Physics, 51, 1988, page 459). Another group of materials which have been studied include the simple rock salt ABX of half Heusler materials. Similar to strategies mentioned above, interpenetrating FCC sublattices have been exploited in MgAgAs type crystal structures. One of many examples of studies of half Heusler materials has been exploiting the phonon mass fluctuation scattering by chemical substitution of a ZrNiSn half Heusler structure by substitution of the heavier group IVB Hf on Zr sites. Additionally, Sb has been substituted on the Sn site with similar outcome (for example, Bhattacharya, S., et. al., Applied Physics Letters 77, (16), 2000).

Recent materials developments include the exploitation of the lower thermal conductivity of cage compounds having a large unit cell containing encapsulated atoms which absorb phonons via a rattling process (for example, Shen, Q., et. al., Applied Physics Letters, 79 (25), pages 4165-4167). The filling of voids with heavy atoms with low vibrational motion has led to considerable activity in the exploitation of clathrates (for example, Alam, H., Ramakrishna, S., Nano Energy, 2013, 2, pages 190-212). Another area of activity is the exploitation of nanostructured skutterdites such as Co1−xNixSb3 whereby significant lowering of thermal conductivity results from phonon scattering from the high concentration of grain boundaries. This approach has developed to include studies in which transport properties are enhanced and lattice thermal conductivity is reduced by introduction of Quantum Dot Superlattices (for example, Bottner, et. al., Materials Research Society Bulletin, (2006) 31, page 211).

Additionally, superlattice nanowires consisting of interlatticed quantum dots facilitate phonon blocking along the wire and the electron tunneling between the Quantum dots enhances electrical conductivity. The future of this work has taken the direction of thin film synthesis. Considerable progress being made in increasing the figure of merit in inorganic polymeric and hybrid materials systems. In addition, progress is being made in employing the processing factor (for example, Bell, L, "Cooling, heating, generating power and recovering waste heat with thermoelectric systems," Science, September 2008, 321, page 1457-1461).

Besides improving the figure-of-merit, there is increasing focus to develop new materials by increasing the electrical power output, decreasing cost and developing environmentally friendly materials. For example, when the fuel cost is low or almost free, such as in waste-heat recovery, then the cost per watt is only determined by the power per unit area and the operating period (for example, Bell, L, "Cooling, heating, generating power and recovering waste heat with thermoelectric systems," Science, September 2008, 321, page 1457-1461). As a result, it has initiated a search for materials with high power output rather than conversion efficiency. For example, the rare earth compound YbAl$_3$ has a low figure-of-merit, but it has a power output of at least double that of any other material.

Another approach to increase the power output of the thermoelectric generators is to increase the temperature difference between the hot and cold sides, i.e., the temperature gradient across the thermoelectric generators, considering the highest hot side temperature that the thermoelectric generator can be subjected to. In addition, the peak output power has been observed to drop at higher temperatures, putting a limit on the maximum hot side temperature. The highest temperature that an available thermoelectric cell can tolerate is 800° C. for thermoelectric generator cells based on calcium Magnesium Oxides. A limited number of thermoelectric generator modules are also available commercially. For example, a thermoelectric generator module with a maximum output power of around 20 W at a temperature difference of 500° C. are offered. These TEGs have a size of 36 cm$^2$ with a thickness of 5 mm.

A challenge in the design of a thermoelectric generator system for converting heat energy to electrical energy is the maintenance of a desired temperature gradient across the thermoelectric generators of the system for a given application. The challenge is made more difficult to address since due to the low efficiency of the available thermoelectric generators, only a small portion of the input heat is converted to electrical energy, i.e., is absorbed by the thermoelectric generator, and the remainder is passed to the cold side of the thermoelectric generator. Thus, since the cold side cannot be actively cooled, a desired cold side temperature cannot generally be maintained, unless it is provided with a constant temperature heat sink, which would not be practical for a continuous operation of a thermoelectric generator system.

A thermoelectric generator (TEG) is a power source which can be modeled as a non-ideal voltage source, $V_G$ with an internal resistance $R_G$, FIG. 4. The open circuit voltage is directly proportional to the temperature difference between the hot and cold sides and is expressed by, $$V_G = NS(T_h - T_c) \tag{1}$$

where N is the number of thermoelectric unicouples connected in series to produce the required voltage, S is the material Seebeck coefficient, and $T_h$ and $T_c$ are the temperature of the hot and cold sides, respectively. Internal resistance of each of the thermoelectric cells is given by the physical dimensions of each of the cell units and the thermal conductivity of the p- and n-type materials. The electrical conductivity of the legs is temperature dependent, giving rise to a temperature dependent resistance. Consequently, the output power delivered by the thermoelectric generator module is dependent on the temperature gradient, i.e., ($T_h - T_c$), as well as the operating temperature and the resistive load $R_L$.

To get a significant output voltage, a very high Seebeck coefficient is needed (high V/° C.). A common approach is to place many TE cells in series, causing the effective output resistance of a generator to be very high (>10Ω). Thus, power is only efficiently transferred to loads with high resistance (i.e., at lower currents); power is otherwise lost across the output resistance. The effect is reduced in certain commercially available devices by putting more elements in parallel and fewer in series, which introduces other shortcomings.

It is appreciated that in any application, the thermoelectric generator system needs to be integrated with the device or system of that application. As such, the thermoelectric generator system performance becomes highly dependent on the effectiveness of the related integration mechanism and how well this mechanism is designed to achieve high heat energy to electrical energy conversion efficiency.

In general, several different heat energy to electrical energy conversion application scenarios may be encountered. These include the following:

1. When the thermoelectric generator system is to be used to harvest waste heat energy and convert it to electrical energy, such as in the case of furnaces, boilers, chimneys, internal combustion engine exhaust, etc. In such applications, the main goal is to harvest as much heat energy as possible without a required system operation critical minimum (excluding the effects of cost and added weight, such as for the case of vehicle exhaust pipe).

2. When the thermoelectric generator system is used to harvest heat energy and convert it to electrical energy not only for the sake of electrical energy generation but also to protect certain components or devices on the thermoelectric generator module cold side from high temperatures. In such scenarios, heat energy "dispersion" and/or "redirection" becomes as if not more important than heat energy absorption (conversion to electrical energy).

3. Applications in which a system is subjected to a high temperature and high heat flux environment for a relatively short period of time, during which the internal components of the system must be protected from the transient high temperature, while at least some of the heat energy is converted to electrical energy to power the internal components of the system. It is noted that hereinafter, "high temperature" is intended to refer to temperatures that are above the maximum limit that the thermoelectric generator to be used can tolerate. Such applications include supersonic munitions that are subjected to transient high temperature heat fluxes for a relatively short period of time at the leasing edges of the projectile, so that their internal components must be protected and the possibility of eliminating or reducing the need for onboard batteries is highly desirable. Other applications include dispatch/insertion of sensory devices into a very high temperature environment to collect sensory data for a relatively short period without the need for wiring and battery.

Many challenges are confronted in the development of high efficiency and reliable Thermoelectric Generator System (TEGS) with high temperature and heat flux input heat sources. To efficiently convert heat energy to electrical energy, a thermoelectric generator system must be capable of:

1. Maintain an optimal temperature gradient across the thermoelectric generator modules of the TEGS; and
2. Minimize the amount of heat energy losses (rejected heat energy, FIG. 3) that are passed through the TEGS without being converted to electrical energy; and
3. The TEGS must be capable of tolerating fluctuations in the input heat flux temperature, even if the temperature is significantly above the maximum temperature that the thermoelectric generator modules of the TEGS can tolerate.

The TEGS capability to tolerate input heat flux temperature fluctuations in very important for achieving high TEGS efficiency since in most applications, the temperature of the input heat flux varies significantly and if the heat flux is to be applied directly to the TEGS thermoelectric generator modules, then the TEGS must be designed to operate at the lowest possible input heat temperature to prevent damage to the thermoelectric modules. However, if the TEGS is provided with a mechanism to regulate the temperature that the thermoelectric module is subjected to, then TEGS can be designed based on the mean input heat flux temperature, while holding the temperature of the hot side of the thermoelectric modules nearly constant and at its optimal level. As a result, the level of electrical energy generation stays nearly constant (even at high or low input heat flux temperatures) and the efficiency of the TEGS can be maximized.

Thermoelectric generator systems have many highly beneficial characteristics if their currently low efficiency of at most 5% to 10% can be significantly improved, including:

Reliability—Thermoelectric generator systems are solid-state devices. They have no moving parts. TSGS can last a very long time. For example, Voyager 1 spacecraft thermoelectric generator has now been operational for over 41 years without any maintenance or repairs.

Quiet—Thermoelectric generator systems can be designed to be completely silent.

No Greenhouse Gases—Thermoelectric generator systems do not generate any greenhouse gases as they operate.

Waste Heat Energy Harvesting—Thermoelectric generator systems can be used to generate electrical energy from waste heat from furnaces, burners, boilers, exhaust pipes, etc., thereby harvesting heat energy that is otherwise wasted and increasing the efficiency of the devices and systems using them.

Wide Range of Fuel Sources—If the input heat is generated from fuel, thermoelectric generators do not have restrictions on fuels that can be used to generate the needed heat.

Scalability—Thermoelectric generator systems can be designed to output power levels smaller than microwatts and larger than kilowatts.

Protection from high temperatures—If properly designed, the TEGS may be used to protect components and structures against high heat sources, particularly from high temperature transient heat fluxes.

Operation Under high and Zero G-forces—Thermoelectric generator systems can operate under zero-G or at very high-G conditions.

Direct Energy Conversion—Thermoelectric generator systems convert heat directly into electricity. Many energy conversion technologies require intermediate steps when converting heat to electricity. For example, heat energy from fuel is converted in a turbine to mechanical energy, then mechanical energy is converted to electricity in a generator. Each energy conversion step adds losses in the form or waste heat. This also makes thermoelectric generator systems less mechanically complex than many other energy conversion technologies.

Compact Size—Thermoelectric generator systems can be designed to be very compact.

Shape Conformal—Thermoelectric generator systems can be designed to conform to the available surfaces geometries and shapes.

In applications such as in high speed gun-fired munitions, during initial stages of the flight the speed might be several times the speed of sound, causing the leading edges to be heated sometimes to over 3,000 degrees C. The flight speed would, however, drop during the flight and the leading-edge temperatures would similarly drop, sometimes from the initial 3000 degrees C. to less than 500 degrees C. or below. In such applications, a sustained thermoelectric generation of power during the flight requires establishment of a suitable temperature gradient between the hot and cold side of the TEG.

FIG. 5 shows a plot of the surface temperature of a projectile as a function of Mach number. For example, at Mach 4 speed the leading edge of a projectile may be exposed to high temperatures and heat fluxes up to 3500° K and 1000 W/cm$^2$, respectively. For the highest temperature TEG currently available, the maximum hot side temperature that the TEG can tolerate is 800° C., which is significantly lower than the leading-edge temperature. In addition, as the projectile speed is decreased, the leading-edge temperature would rapidly drop, e.g., to below 500° C. at Mach 1.5. It is therefore highly desirable to maintain a desired temperature gradient across TEGs used in such projectiles so that they could serve as a reliable power source in such applications. Such TEG systems can then be designed to operate optimally in a wide range of leading-edge temperatures. In high speed gun-fired munitions, due to limitations in the available space, the developed innovative solutions must also be capable of being constructed in relatively small volumes.

SUMMARY

There is therefore a need for methods that can be used to develop thermoelectric generator systems that can convert heat energy to electrical energy with efficiencies that are significantly higher than those that are currently available. The low efficiency of currently available thermoelectric generator systems has made them suitable only for very limited applications. The very low efficiency of the thermoelectric generator systems has not only made them impractical from cost point of view but has also made them impractical from a physical size point of view for many applications.

There is also therefore a need for methods that can be used to develop thermoelectric generator systems with several fold increase in efficiency as compare to the efficiency of currently available thermoelectric generator systems.

There is also a need for methods that can be used to develop thermoelectric generator systems that can maintain temperature gradient across thermoelectric generator modules of the thermoelectric generator system while the temperature of the input heat influx varies so that the TEGS can function as a predictable and reliable source of electrical energy that harvests heat energy, particularly waste heat energy, and converts it to electrical energy.

There is also a need for methods that can be used to develop thermoelectric generator systems that are capable of tolerating fluctuations in the input heat flux temperature, even if the temperature is significantly above the maximum temperature that the thermoelectric generator modules of the of the thermoelectric generator system can tolerate.

There is also a need for methods that can be used to develop thermoelectric generator systems with minimal heat energy losses (rejected heat energy) that are passed through the thermoelectric generator system without being converted to electrical energy.

Accordingly, methods are provided for the development of thermoelectric generator systems with significantly higher system efficiency that is currently available and that:
  a) Can maintain an optimal temperature gradient across the thermoelectric generator modules of the thermoelectric generator system; and
  b) Can minimize the amount of heat energy losses (rejected heat energy) that are passed through the thermoelectric generator system without being converted to electrical energy; and
  c) Are capable of tolerating fluctuations in the input heat flux temperature, even if the temperature is significantly above the maximum temperature that the thermoelectric generator modules of the TEGS can tolerate.

In addition, mechanisms are provided for regulating the input heat flux temperature on the hot side of the thermoelectric generator modules of the thermoelectric generator system to keep the temperature close to a desired temperature, usually at a temperature at which the thermoelectric generator modules can provide maximum electrical energy.

Furthermore, passive mechanisms are provided for regulating the input heat flux temperature on the hot side of the thermoelectric generator modules of the thermoelectric generator system to keep the temperature close to a desired temperature, usually at a temperature at which the thermoelectric generator modules can provide maximum electrical energy.

Furthermore, highly efficient multi-stage thermoelectric generator systems are provided to further increase the efficiency with which input heat energy can be converted to electrical energy.

Furthermore, highly efficient thermoelectric generators with passive mechanisms are provided to control heat flux into thermoelectric generators and maximize the efficiency of the TEGS.

Furthermore, highly efficient thermoelectric generators with active components are provided to control heat flux into thermoelectric generators and maximize the efficiency of the TEGS.

In addition, new classes of highly efficient thermoelectric generator systems for harvesting heat energy and conversion to electrical energy are presented for applications with different thermal, structural and operational characteristics.

Furthermore, highly efficient thermoelectric generator systems are provided for converting waste heat energy into electrical energy in systems in which the temperature of the input heat flux into the TEGS is significantly higher than the maximum temperature that the thermoelectric generator modules of the TEGS can tolerate.

Furthermore, highly efficient thermoelectric generator systems are also provided for converting waste heat energy into electrical energy in systems in which the temperature of the input heat flux into the TEGS fluctuates significantly and at times is significantly higher than the maximum temperature that the thermoelectric generator modules of the TEGS can tolerate.

Furthermore, highly efficient thermoelectric generator systems are also provided for converting waste heat energy into electrical energy for systems that are subjected to transient high temperature heat fluxes in which the temperature of the input heat flux into the TEGS may fluctuate significantly and at times be significantly higher than the maximum temperature that the thermoelectric generator modules of the TEGS can tolerate. In such applications, the TEGS may also be required to protect the internal components of host system from high temperatures.

Furthermore, highly efficient thermoelectric generator systems are also provided for converting waste heat energy into electrical energy for systems that are subjected to transient high temperature heat fluxes in which the temperature of the input heat flux into the TEGS may also fluctuate significantly and at times be significantly higher than the maximum temperature that the thermoelectric generator modules of the TEGS can tolerate. In such applications, the TEGS may be desired to store a significant amount of (excess) heat energy for conversion to electrical energy after the input heat flux has ceased or its temperature has dropped below the level at which the thermoelectric generator modules of the TEGS can efficiently generate electrical energy. In such applications, the TEGS may also be required to protect the internal components of the host system from high temperatures.

BRIEF DESCRIPTION OF THE DRAWINGS

These and other features, aspects, and advantages of the apparatus of the present invention will become better understood with regards to the following description, appended claims, and accompanying drawings where:

DETAILED DESCRIPTION

Figure 1:
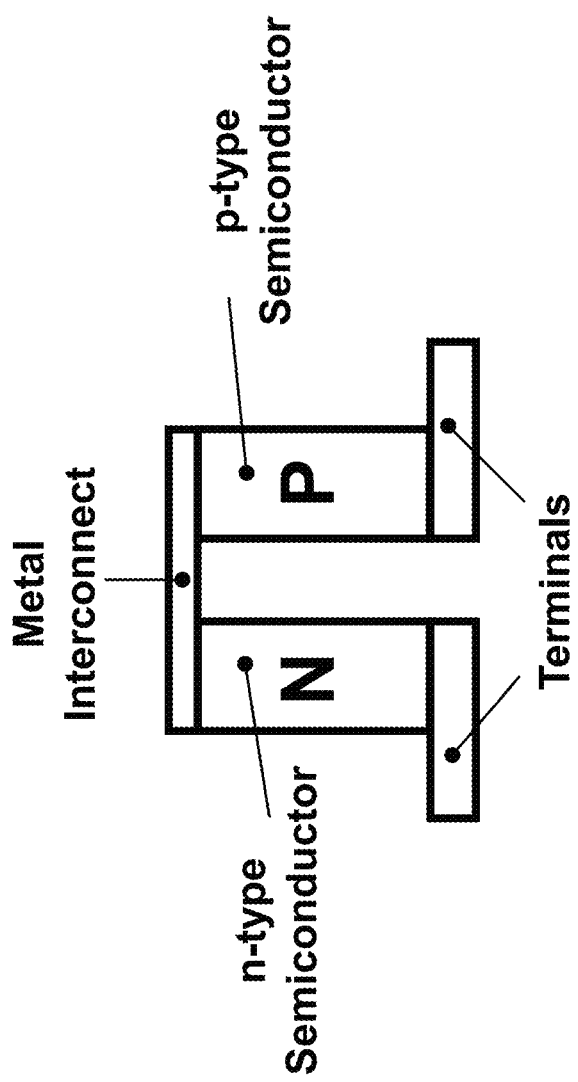
FIG. 1 illustrates the schematic of a basic thermoelectric generator couple of the prior art.
Figure 2:
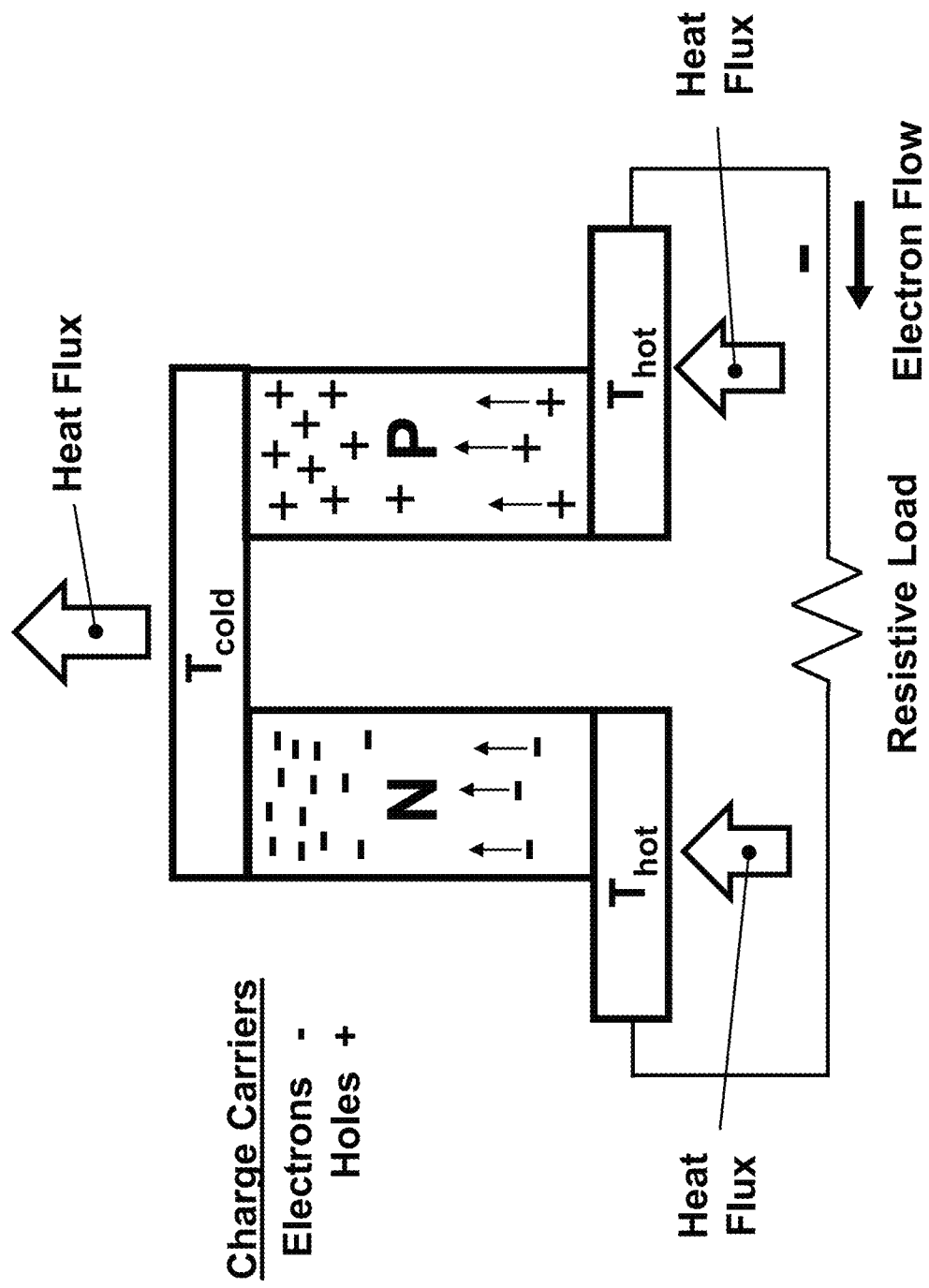
FIG. 2 illustrates the thermoelectric generator charge carrier and flow of the resulting electrical current through a load of the prior art.

The first embodiment of the present thermoelectric generator based heat energy harvesters to generate electrical energy, hereinafter called "Thermoelectric Generator Systems" (TEGS), are specifically designed for applications in which the TEGS is rapidly exposed to a very high temperature and heat flux for a certain amount of relatively short period of time and that the exposed temperature would then begin to drop to temperatures that may be even below the temperature that the TEGS thermoelectric generator (TEG) can tolerate.

It is noted that in the present disclosure, the "very high temperature" is intended to indicate temperatures that are higher than the temperature that the high temperature side of the thermoelectric generator (TEG) used in the TEGS can tolerate. Such conditions are, for example, encountered by leading edges of many high Mach speed munitions. When such munitions are also provided with the capability of being maneuverable, their leading edges may be exposed to high temperatures and heat fluxes that are highly varying during the flight. Other similar non-munitions applications are, for example, boilers in residential heating systems in which the burner is on only periodically generating high temperature to heat water, during which time a significant amount of heat energy is lost to the environment, and is then turned off. Similar scenarios are encountered in many industrial systems such as many temperature-controlled furnaces that undergo rapid heating and cooling cycles.

The specific characteristics of such applications include the following:

The hot side temperature (for example, 2000° C. to 3000° C. or even higher) is significantly higher than can be tolerated by currently available TEGs (800° C. for TEG based on calcium Magnesium Oxides) and those that are being explored.

The high input heat fluxes of (for example, as high as 500-1000 W/cm$^2$) are significantly higher than the maximum amount of heat energy that can be absorbed by the best TEG (i.e., converted to electrical energy). As a result, the TEG is not capable of reducing the hot side temperature.

Unlike those applications in which heat energy at a relatively constant temperature is provided continuously to the TEG for conversion to electrical energy, in the above applications, the heat energy harvesting is for a relatively short periods of time, but may cyclic or repeated in a less regularly occurring intervals.

The methods for the development of "Thermoelectric Generator System" (TEGS) that are suitable for the above applications can therefore have one or more of the following characteristics:

1. Since the temperature on the hot side of the TEG is significantly higher than the temperature that TEGs can tolerate, an intermediate medium can be provided between the high temperature side and the TEGs of the TEGS.
2. The intermediate medium (mechanism) can have the necessary thermal time constant to protect the TEG for the duration of the high temperature period of each aforementioned thermal cycle to which the TEGS is subjected. Optimally, the intermediate medium (mechanism) isolates the TEGs of the TEGS from temperature fluctuations, particularly the high peak temperature spikes of various durations. In addition, the developed TEGS becomes highly efficient if the intermediate medium (mechanism) can sustain a prescribed temperature on the hot side of the TEGs of the TEGS.
3. In addition, the developed TEGS becomes highly efficient and can serve as a predictable and reliable source of electrical energy if the TEGS can sustain prescribed temperatures on both the hot and the cold side of the TEGs of the TEGS.

Figure 6:
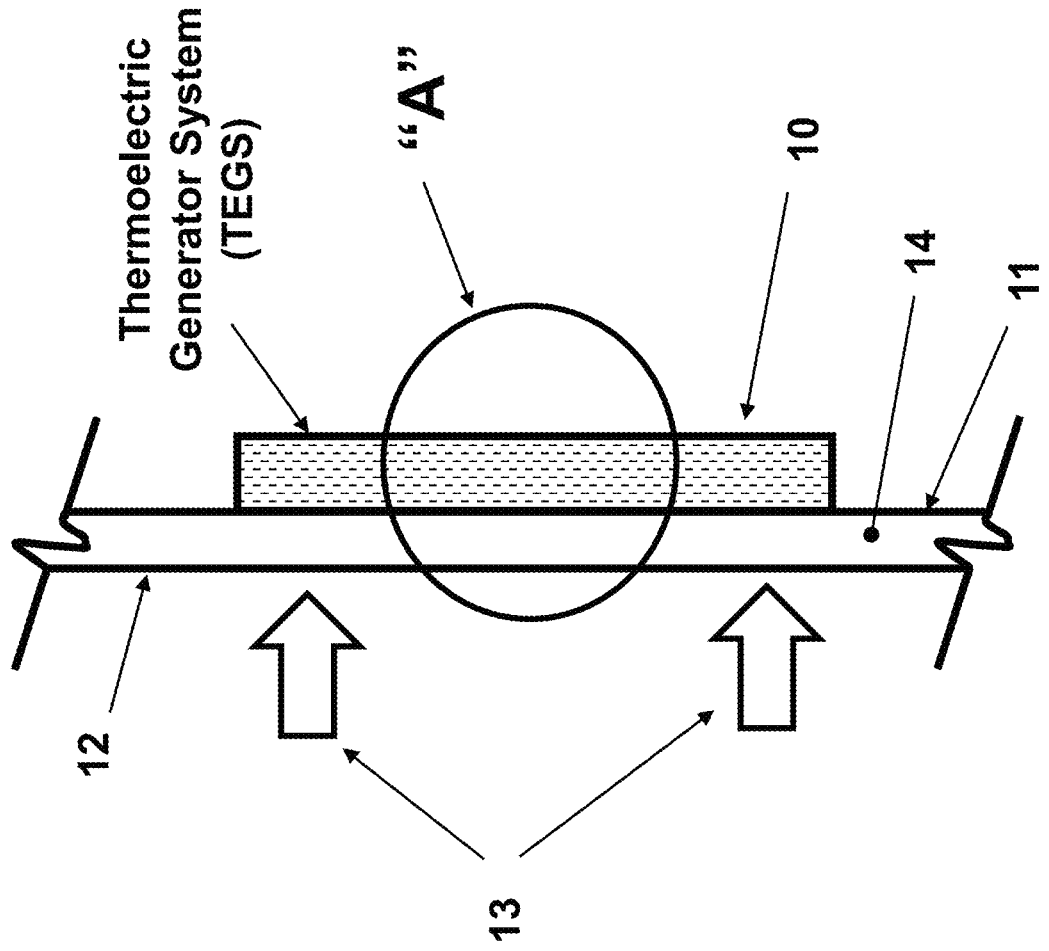
FIG. 6 illustrates an overall view of a first embodiment of a Thermoelectric Generator System (TEGS) as attached to a high temperature and high heat flux surface.
Figure 7:
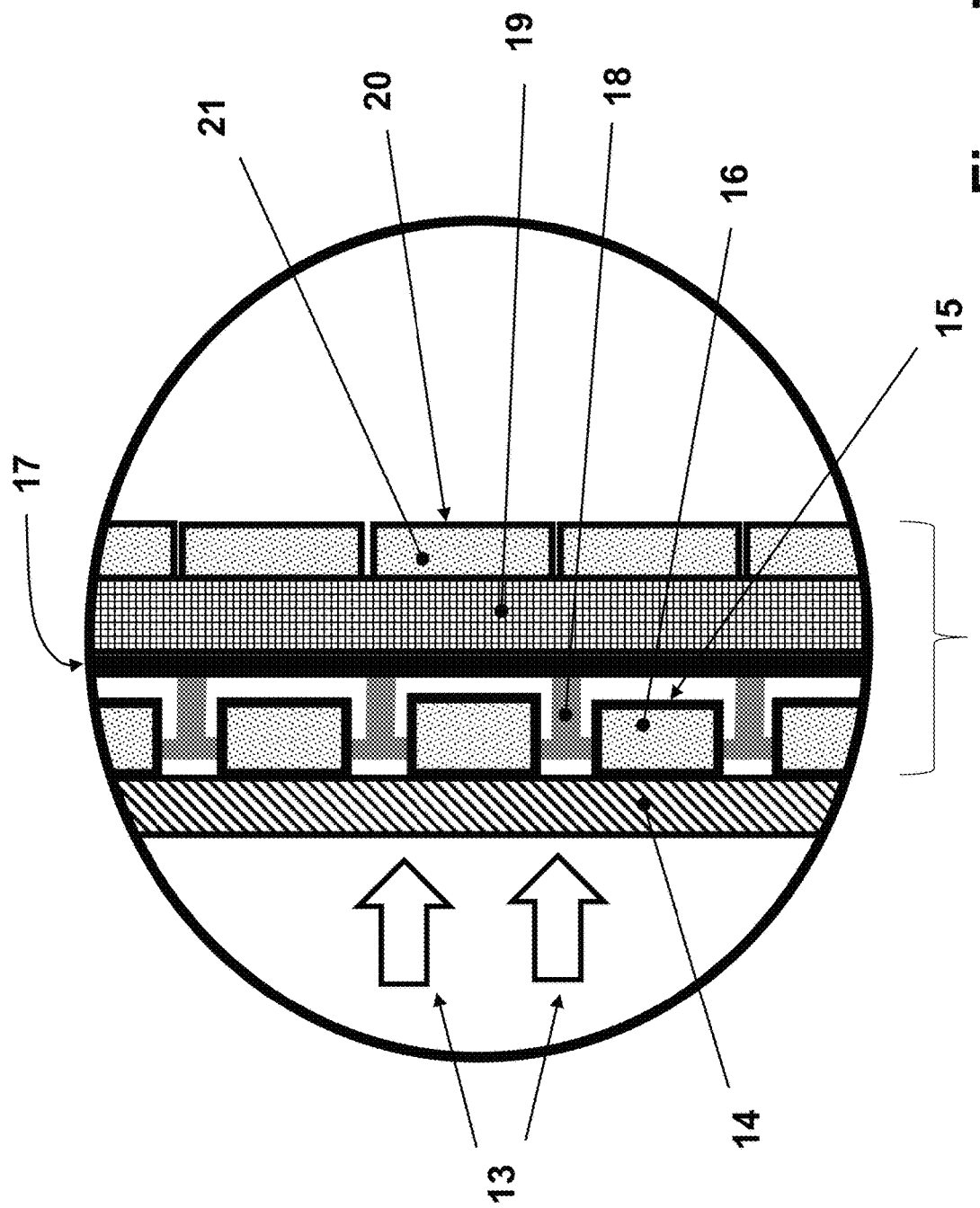
FIG. 7 illustrates the details of the first embodiment construction as viewed in the blow-up view "A" of FIG. 6.
Figure 8:
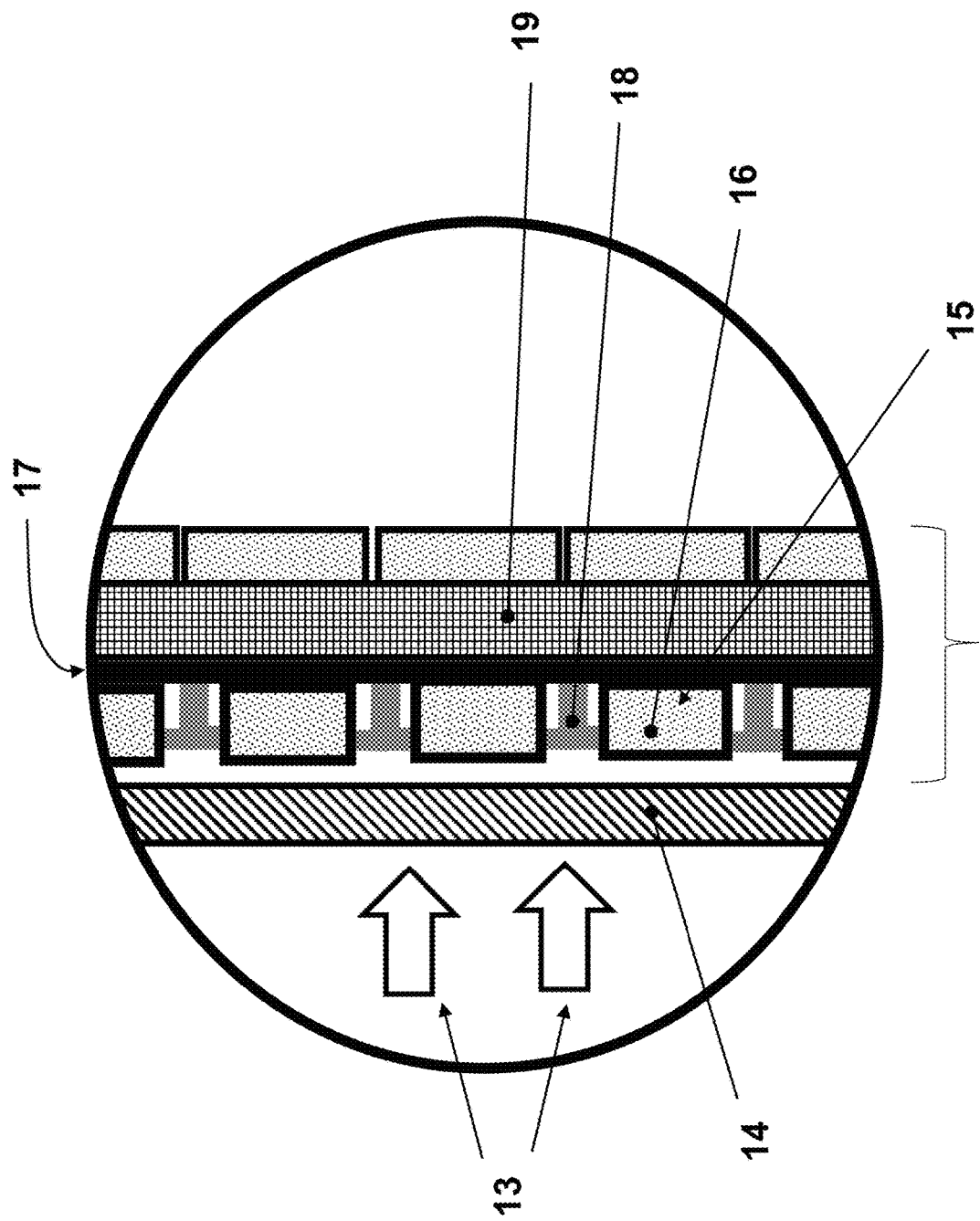
FIG. 8 illustrates the TEGS embodiment component configuration following retraction of the phase change filled containers by the provided passive actuators of the system.

The overall view of the first Thermoelectric Generator System (TEGS) embodiment 10 is presented in FIG. 6. In FIG. 6, the TEGS embodiment 10 is shown to be attached to the inner surface 11 of the plate 14, the outer surface 12 of which is exposed to the high temperature heat flux 13. As an example, in a supersonic projectile, the plate 14 may be the leading-edge skin of the projectile. Similarly, in a heat treatment furnace, the plate 14 may indicate the outer layer of the furnace wall. In FIG. 6, the blow-up view "A", showing the basic method of designing such thermoelectric generator systems and an example of its construction and operation, are illustrated in FIGS. 7 and 8. The TEGS embodiment 10 of FIG. 6 as shown in the views of FIGS. 7 and 8 are configured considering the unique characteristics enumerated above.

The blow-up view "A" of FIGS. 7 and 8 are herein used to describe a method of configured such thermoelectric generator systems considering the unique characteristics enumerated above. As can be seen in the schematic of FIG. 7, the Thermoelectric Generator System (TEGS) embodiment 10, FIG. 6, is constructed with sealed containers 15, which is filled with a material 16 that is configured to melt (phase change) at a desired temperature. The sealed containers 15 are normally in contact with the inside surface 11, FIG. 6, of the plate 14.

The casing of the container 15 is selected to ensure that it could withstand the high temperatures of the heat influx 13. For example, the casing of the container 15 may be made out of stainless steel and the filling phase-changing material be made out of an aluminum alloy with a melting temperature of 500° C. or zinc or tin, with melting temperatures of 420° C. and 230° C., respectively.

The sealed containers 15 are connected to a base intermediate plate 17 via passive thermal actuators 18, FIG. 7. The intermediate plate 17 may also be used for attaching the TEGS assembly 10 to the plate 14. The passive actuators 18 may be constructed as well-known bi-metal device or a shape-memory based actuation device that are designed to retract the sealed containers 15 away from the plate 14 when they reach a prescribed temperature. This configuration of the TEGS is shown in the schematic of FIG. 8. Thereby, a prescribed distance is provided between the containers 15 and the inner surface 11, FIG. 6, of the plate 14, thereby reducing the amount of heat that is transmitted from to the containers 15. It is appreciated that by providing the gap between the containers 15 and the inner surface 11 of the plate 14, the mode of heat transfer from the plate 14 to the containers 15 becomes mainly through radiation with minimal direct conduction.

Figure 3:
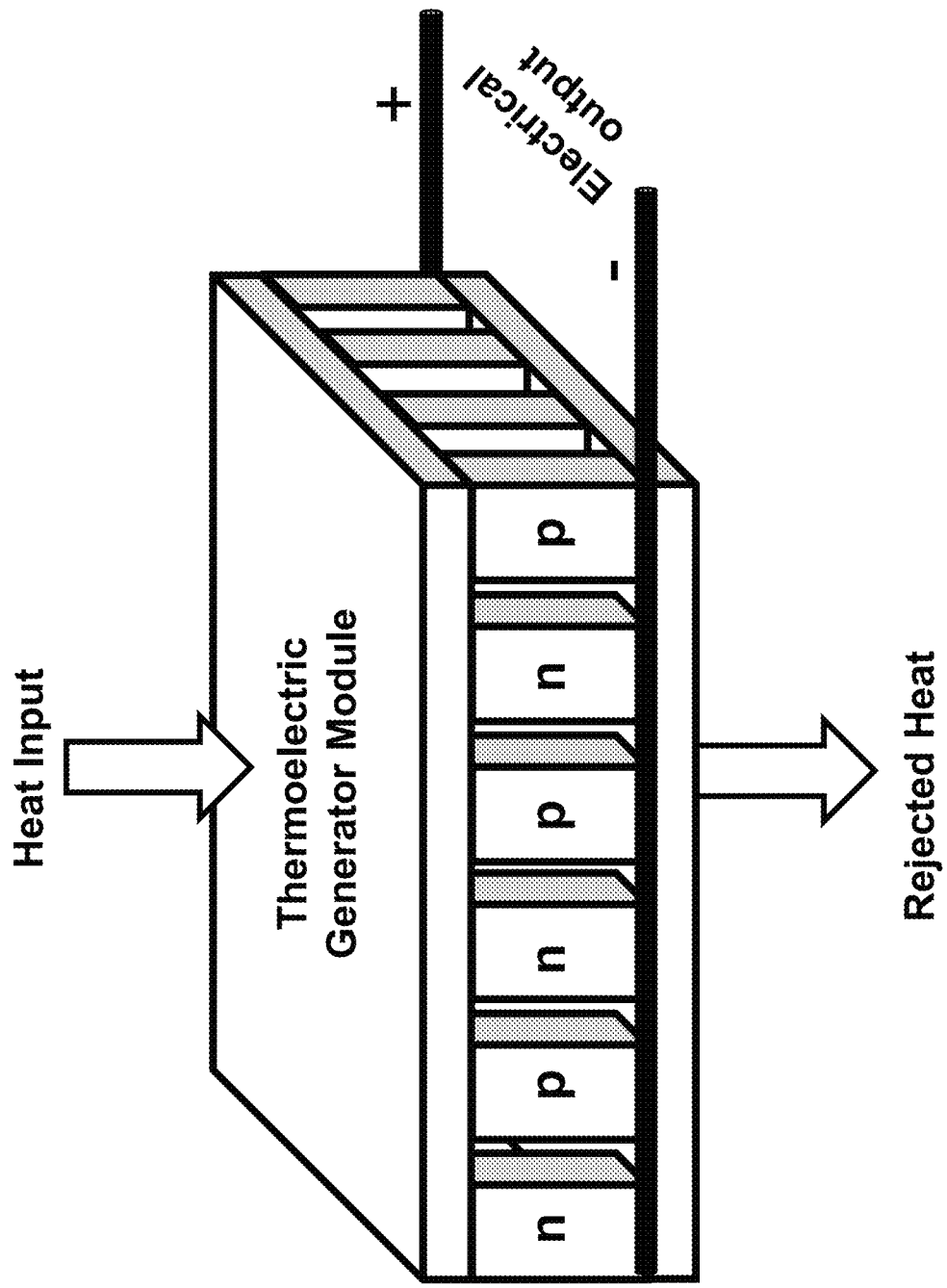
FIG. 3 illustrates a thermoelectric generator module of the prior art.
Figure 4:
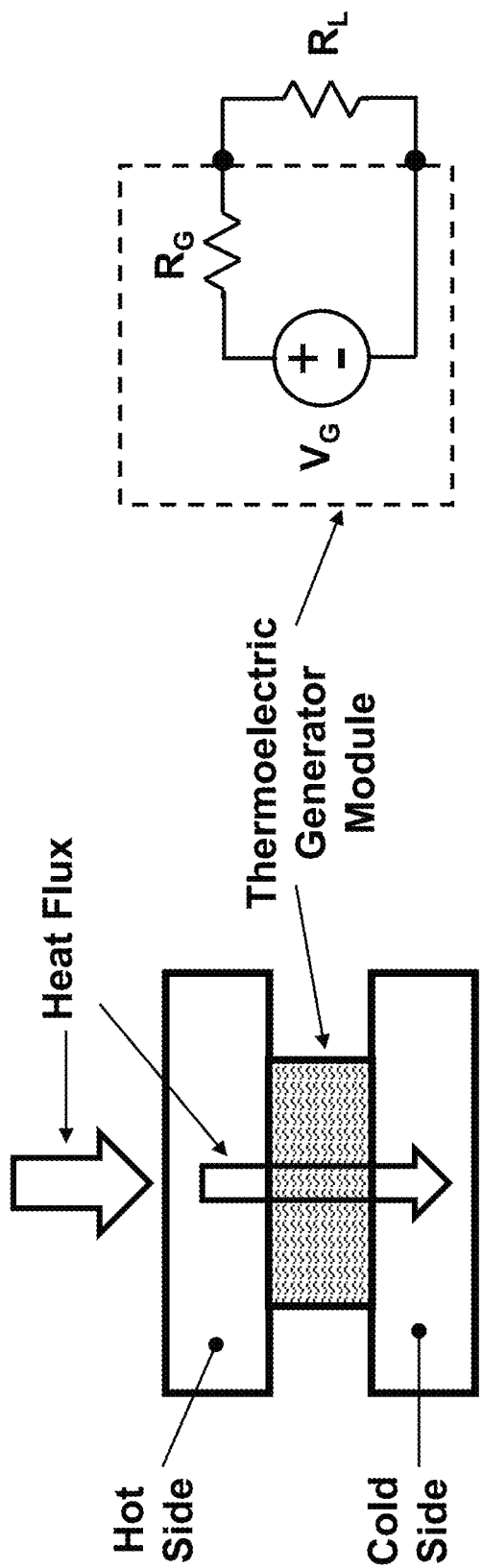
FIG. 4 illustrates a thermoelectric generator module and its equivalent electric circuit of the prior art.
Figure 5:
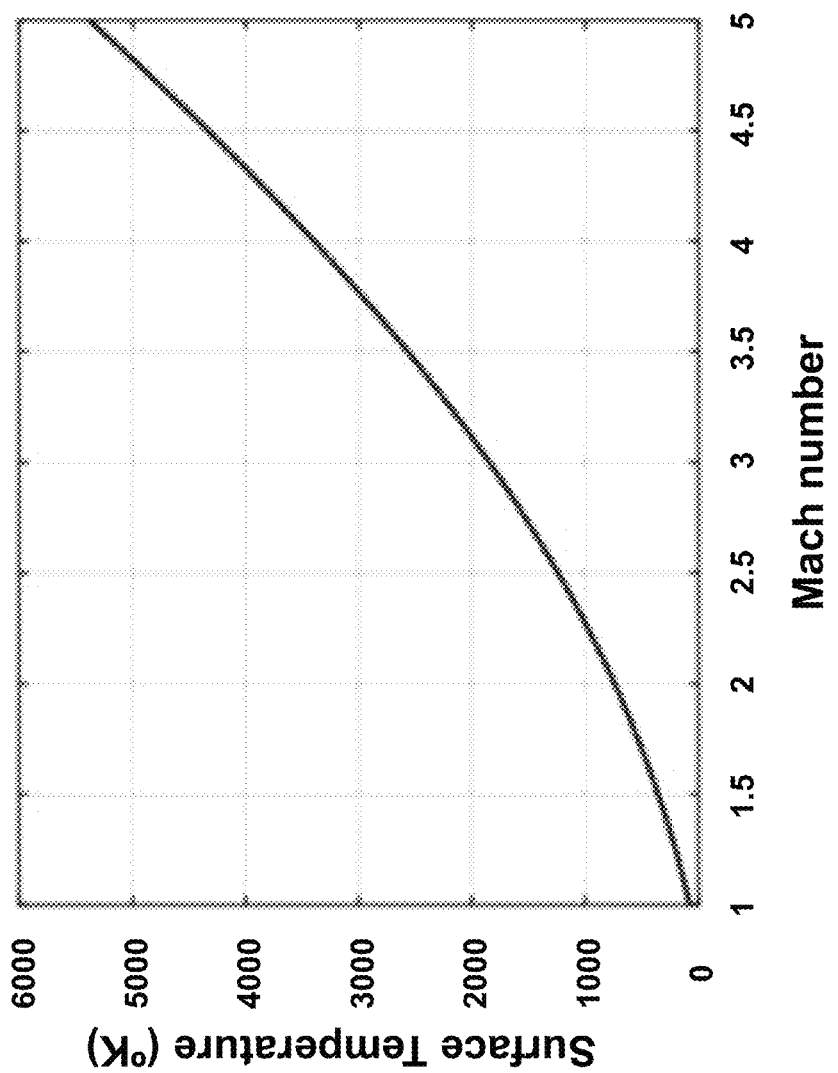
FIG. 5 illustrates a plot of a leading-edge surface of a projectile temperature as a function of Mach number as known in the prior art.

The hot side of the thermoelectric generator modules 19, FIG. 3, are then attached to intermediate plate 17 as shown in FIG. 7. On the cold side of the thermoelectric generator modules, sealed containers 20 are provided, which are filled with (phase changing) materials 21 with lower melting temperature than those the material 16. In the TEGS embodiment 10 of the present invention, the difference between the melting temperatures of the materials 16 and 21 of the sealed containers 15 and 20, respectively, is to provide the desired temperature gradient across the thermoelectric generator modules 19 as described later in this disclosure.

It is appreciated by those skilled in the art that the reason for constraining the phase changing materials 16 and 21 in sealed containers 15 and 20, respectively, is so that following melting, the melted material does not flow away and keep on absorbing heat energy without an increase in their temperatures.

In the TEGS embodiment 10 of FIGS. 6-8, the function of the phase change material 16 filled sealed container and the passive actuation devices 18 (bimetal or shape memory or the like) is to protect the thermoelectric generator modules 19 of the TEGS from higher temperatures that they can tolerate. Hereinafter, such assemblies are indicated as "high-temperature protection mechanisms".

The "high-temperature protection mechanism" can be configured to:

1—limit the TEG module hot side temperature level to protect the TEG modules from temperatures above their maximum operating temperature.

2—keep the TEG module hot side temperature at a predetermined constant temperature for optimal performance of the TEG modules as the high temperature input heat flux raises the temperature of the plate 14, FIGS. 6 and 7, beyond the maximum operating temperature of the TEG modules.

The high-temperature protection mechanism consists of the aforementioned arrays of sealed containers 15 filled with solid phase-change materials 16 that are normally positioned against the plate 14 to which the TEGS is attached, FIGS. 6 and 7. The plate 14 is subjected to the high temperature heat flux that is intended to be harvested by the TEGS and converted to electrical energy. The solid phase-change material containers 15 are held against the TEGS housing shells by surrounding passive bi-metal or shape memory or the like actuators. The passive (e.g., bi-metal) actuators are mounted on an actuator base intermediate plate 17, to which the TEG modules are attached, and through which heat energy is transmitted to the TEG cells of the module. The high-temperature protection mechanism functions as follows:

Prior to TEGS exposure to high temperature heat flux 13, the solid phase-change material 16 in the sealed containers 15 are normally pressed against the inner surface 11 of the heat flux exposed plate 14, FIGS. 6 and 7.

Once the TEGS is exposed to the high temperature heat flux 13, as the temperature of the plate 14 rises, heat is transmitted to the container 15 and to its filled solid phase-change material 16 and through radiation and conduction to the TEG modules via the intermediate plate 17.

The phase-change material 16 is configured to melt at a prescribed high temperature limit that the TEG can tolerate (e.g., a zinc and copper alloy for 800° C. that TEG modules based on calcium Magnesium Oxides can tolerate). Thereby, as the temperature of the plate 14 rises well above the high temperature limit of the TEG modules, the phase-change material would absorb the heat and as the temperature reaches its melting point, it begin to melt, absorbing heat at its constant melting temperature.

Once the phase-change material 16 in the filled container 15 has melted, the temperature of the bi-metal actuators 18 begins to rise above the melting temperature of the material 16. At a certain preset higher temperature, the passive bi-metal actuators 18 are configured to begin moving the container 15 away from the inner surface 11 of the plate 14 and press them against the intermediate plate 17, thereby lowing the rate at which heat energy is transmitted to the container 15 and thereby the phase change material 16 as shown in the schematic of FIG. 8. In this state of the TEGS, heat is primarily transmitted to the container 24 via radiation, while heat energy is being transmitted to the TEG modules 19 via conduction.

As a result, by proper design of the high-temperature protection mechanism of the TEGS, the temperature of the hot side of the TEG modules of the TEGS can be kept close to the predetermined optimal temperature, usually the maximum allowable temperature for the TEG type being used, during nearly the entire duration of the operational cycle of the TEGS.

As can be seen in the schematic of the FIG. 7, on the cold side of the thermoelectric generator modules, containers 20 are provided, which are filled with (phase changing) materials 21 (for example zinc and copper alloy for 800° C.) with lower melting temperature than those the materials 16. In the TEGS embodiment 10 of the present invention, the difference between the melting temperatures of the materials 16 and 21 of the sealed containers 15 and 20, respectively, is to provide the desired temperature gradient across the thermoelectric generator modules 19 as described later in this disclosure. It is appreciated that the heat flux entering the hot side of the TEG modules is partially converted to electrical energy by the TEG modules (with most currently available TEG modules, usually less than 10% is converted to electrical energy) and the remainder is passed through, in the case of the TEGS of FIG. 7, to the containers 20 and thereby to the filling phase changing materials 21 (for example, tin at 230° C.), which is selected to have a lower melting temperature than the material 16. Then the materials 21 begins to melt and keeps on absorbing heat at its constant melting and molten temperature. As a result, while the phase changing materials 16 and 21 are in molten phase, their temperatures are constant and thereby a constant temperature gradient is applied across the TEG modules 19 of the TEGS.

Therefore, by the proper design of the bi-metal (shape memory or the like) actuators 18 and sizing of the volumes of the phase-change material 16 and 21, FIG. 7, the thermoelectric generator modules 19 are subjected to a nearly constant and predetermined temperature gradient during a significant, if not most, of the operating cycle of the TEGS. As a result, a highly predictable and reliable power source is provided that is not sensitive to the unavoidable input temperature and heat flux 13 variations.

It is also appreciated that once the input temperature and heat flux 13, FIG. 7, has dropped below the optimal hot side temperature of the TEG modules 19, the temperature of the molten phase-change material 16 stays constant due to the latent heat of melting of the material for a considerable amount of time. As a result, while the molten phase-change material 16 on the hot side of the TEG modules 19 is cooling and solidifying, the temperature gradient across the TEG modules stays at its optimal level and the TEG modules 19 would generate their designed level of electrical energy.

In the TEGS embodiment 10 of FIG. 7, the container 15 of the phase change material 16 is initially in contact with the inner surface 11 of the plate 14 and transfers heat to the intermediate plate 17 and thereby the TEG modules 21 mainly though radiation and then when it is heated to the prescribed temperature, the container 15 is pulled back and comes into contact with the intermediate plate 17, beginning to transfer to the 17 and thereby the TEG modules mainly via conduction.

Figure 9:
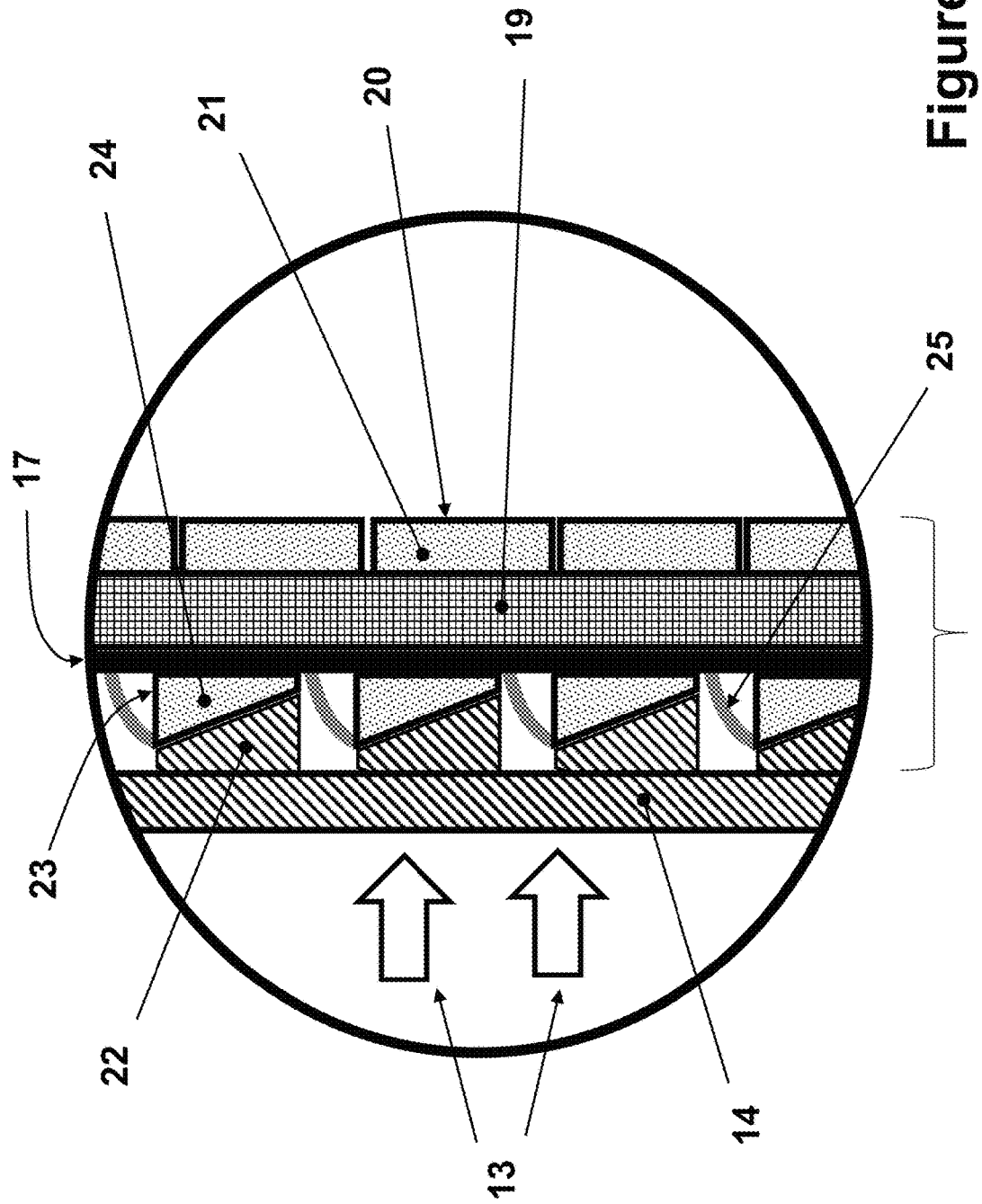
FIG. 9 illustrates the details of the modified first TEGS embodiment construction as viewed in the blow-up view "A" of FIG. 6.
Figure 10:
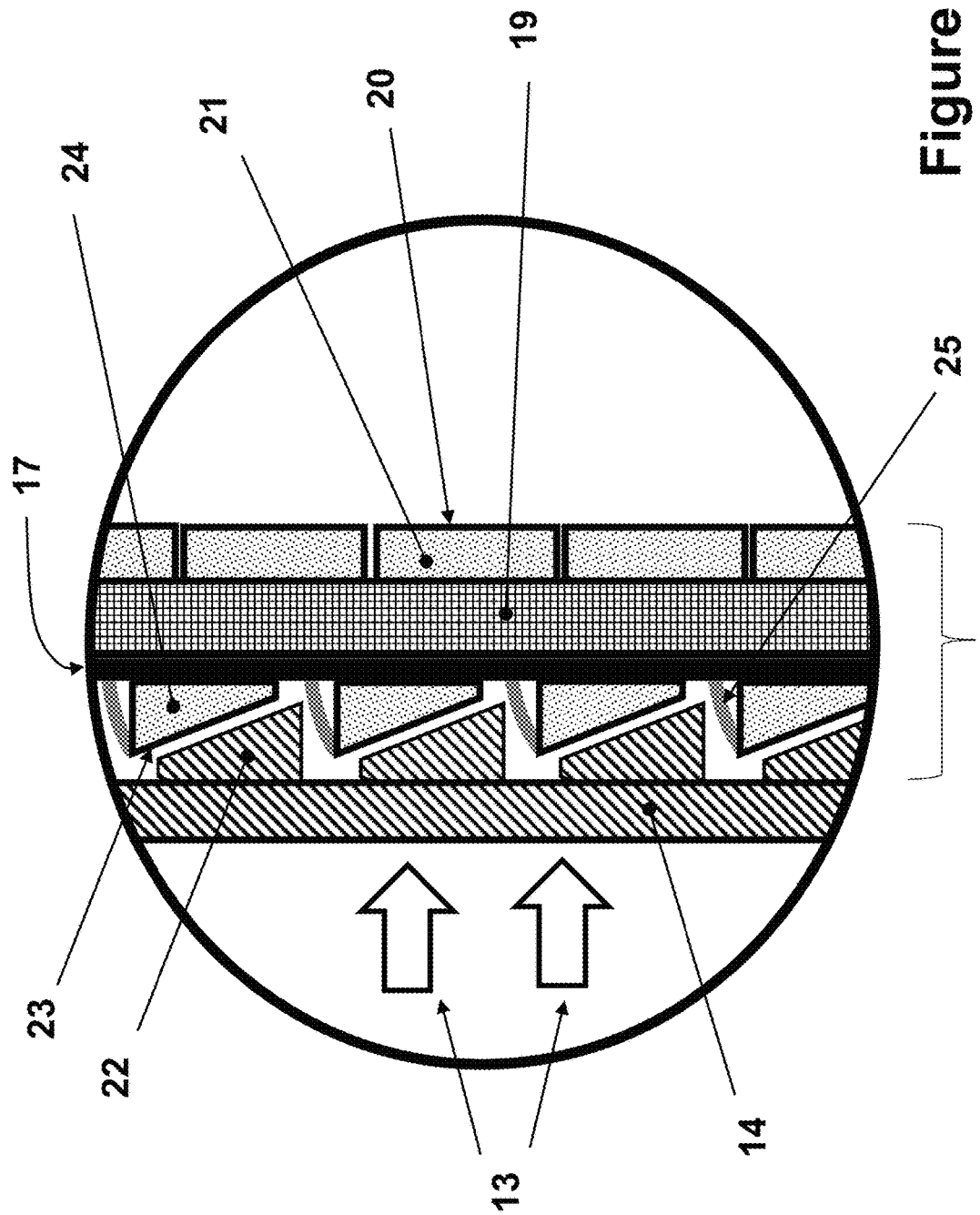
FIG. 10 illustrates the TEGS embodiment of FIG. 9 with the configuration of components following retraction of the phase change filled containers by the provided passive actuators of the system.

In an alternative embodiment of the TEGS shown in the blow-up view schematic of FIG. 9, the container 15 is initially in contact with the inner surface 11 of the plate 14 as well as with the intermediate plate 17, as shown in the schematic of FIG. 9. Then once the container 15 temperature is raised to a prescribed level by the incoming high temperature heat flux, which is generally a temperature that is reached after all or most of the phase changing material 16 is melted, then the container 15 is retracted away from the surface 11 of the plate 14, while staying in contact with the surface of the intermediate plate 17 by the provided passive bi-metal or shape memory or the like actuators. This configuration of the TEGS embodiment of FIG. 9 is shown in the schematic of FIG. 10.

In the modified TEGS embodiment of FIG. 9, the TEGS embodiment 10, FIG. 6, is also attached to the inner surface 11 of the plate 14, the outer surface 12 of which is exposed to the high temperature heat flux 13 as shown in FIG. 7. All components of the TEGS embodiments of FIGS. 7 and 9 are identical except for the containers 15, passive actuators 18 and the addition of the contacting surfaces 24 described below.

In the modified TEGS embodiment of FIG. 9, the plate 14 is provided with protruding members 22 with the outer sloped surfaces as shown in FIG. 9. The protruding members are either fixedly attached to the plate 14 or are preferably integral to the plate 14. The containers 23 of the phase change material 24 are also provided with matching sloped surfaces as can be seen in FIG. 9. In the configuration shown in FIG. 9, the containers 23 are in contact with the sloped surfaces of the protruding members 22 on one side and with the intermediate plate 17 on the opposite side. In this configuration, the provided passive bi-metal or shape memory or the like actuators 25 keep the containers 23 in contact with the said surfaces.

The operation of the modified TEGS embodiment of FIG. 9 is similar to that of the TEGS embodiment of FIG. 7. Prior to TEGS exposure to high temperature heat flux 13, the sealed containers 23 filled with the solid phase-change material 24 are normally pressed against the sloped surfaces of the protruding members 22 of the heat flux exposed plate 14. Once the TEGS is exposed to the high temperature heat flux 13, as the temperature of the plate 14 rises, heat is transmitted to the container 23 and to its filled solid phase-change material 24 and through conduction to the TEG modules 19 via the intermediate plate 17.

The phase-change material 24 is designed to melt at a prescribed high temperature limit that the TEG can tolerate (e.g., a zinc and copper alloy for 800° C. that TEG modules based on calcium Magnesium Oxides can tolerate). Thereby, as the temperature of the plate 14 rises well above the high temperature limit of the TEG modules, the phase-change material 24 would absorb the heat and when its temperature reaches the material melting point, it begin to melt, absorbing heat at its constant melting temperature.

Once the phase-change material 24 in the filled container 23 has been melted, the temperature of the passive bi-metal (shape memory or the like) actuators 25 begins to rise. Once the temperature of the passive bi-metal actuators 25 has reached a preset threshold, the actuators are designed to move the containers 23 upward as viewed in the schematic of FIG. 9 and thereby creating a gap between the sloped surfaces of the protruding members 22 and the containers 23, while the containers 23 are still in contact with the surface of the intermediate plate 17 as shown in the schematic of FIG. 10. Thus, lowing the rate at which heat energy is transmitted from the plate 14 to the containers 23 and thereby the phase change material 24. In this state of the TEGS, heat is primarily transmitted to the container 23 via radiation, while heat energy is being transmitted to the TEG modules 19 via conduction.

As a result, by proper design of the latter "high-temperature protection mechanism" of the TEGS, the temperature of the hot side of the TEG modules of the TEGS can be kept close to the predetermined optimal temperature, usually the maximum allowable temperature for the TEG type being used, during nearly the entire duration of the operational cycle of the TEGS.

As can be seen in the schematic of the FIG. 9, on the cold side of the thermoelectric generator modules, containers 20, filled with (phase changing) materials 21, are still provided and are designed to function as was previously described for the embodiment of FIG. 7. Thus, by the proper design of the passive bi-metal (shape memory or the like) actuators 25 and sizing of the volumes of the phase-change material 24 and 21, FIG. 9, the thermoelectric generator modules 19 are subjected to a nearly constant and predetermined temperature gradient during a significant, if not most, of the operating cycle of the TEGS. As a result, a highly predictable and reliable power source is provided that is not sensitive to the unavoidable input temperature and heat flux 13 variations.

It is also appreciated that once the input temperature and heat flux 13, FIG. 9, has dropped below the optimal hot side temperature of the TEG modules 19, the temperature of the molten phase-change material 24 stays constant due to the latent heat of melting of the material for a considerable amount of time. As a result, while the molten phase-change material 24 on the hot side of the TEG modules 19 is cooling and solidifying, the temperature gradient across the TEG modules stays at its optimal level and the TEG modules 19 would generate their designed level of electrical energy.

Figure 11:
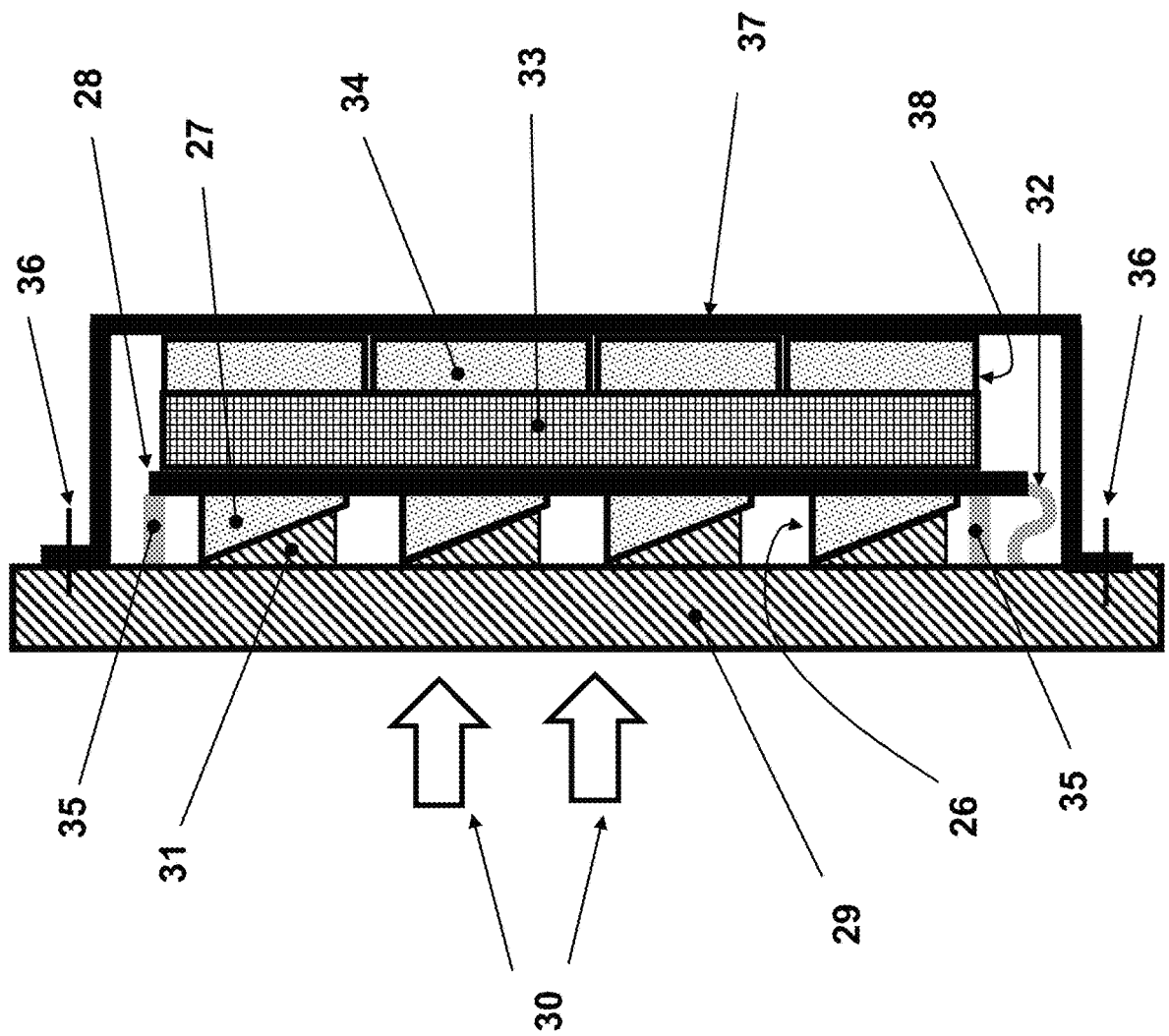
FIG. 11 illustrates the details of the modified TEGS embodiment of FIG. 9.

In a modified TEGS embodiment of FIG. 9 shown in the schematic of FIG. 11, the containers 23 (26 in FIG. 11) of the phase change materials 24 (27 in FIG. 11) are fixedly attached to the intermediate plate 17 (28 in FIG. 11). The containers 26 may also be integral with the intermediate plate 28. In FIG. 11 one TEGS unit is shown as attached to the plate 29 (14 in FIG. 9), which is exposed to the high temperature heat flux 30 (13 in FIG. 9). The intermediate plate 28 rests on the TEG modules 19 and is free to slide over it. If needed, a thin metal plate, for example stainless steel plate, may be used to cover the TEG modules for protection and to minimize wear.

The method of constructing a typical modified TEGS embodiment type of FIG. 11 is illustrated. The schematic of FIG. 11 shows a typical TEGS unit as attached to the plate 29, which is exposed to the high temperature heat flux 30. Similar to the TEGS embodiment of FIG. 9, the plate 29 (14 in FIG. 9) is provided with protruding members 31 (22 in FIG. 9) with the outer sloped surfaces as shown in FIG. 11. The protruding members 31 are also either fixedly attached to the plate 29 or are preferably integral to the plate 29. The containers 26 of the phase change material 27 are also similarly provided with matching sloped surfaces as can be seen in FIG. 11. In the configuration shown in FIG. 11, the containers 26 are in contact with the sloped surfaces of the protruding members 31 on one side and with the intermediate plate 28 (17 in FIG. 9) on the opposite side. In this configuration, the provided passive bi-metal or shape memory or the like actuator(s) 32 keeps the intermediate plate 28 positioned as shown in FIG. 11 and the containers 26 in contact with the surfaces.

The operation of the modified TEGS embodiment of FIG. 11 is similar to that of the TEGS embodiment of FIG. 9. Prior to TEGS exposure to high temperature heat flux 30, the sealed containers 26 filled with the solid phase-change materials 27 are pressed against the sloped surface of the protruding members 31 of the heat flux exposed plate 29. Once the TEGS is exposed to the high temperature heat flux 30, as the temperature of the protruding member 31 rises, heat is transmitted to the container 26 and to its filled solid phase-change material 27 and through conduction to the TEG modules 33 via the intermediate plate 28.

The phase-change material 27 is designed to melt at a prescribed high temperature limit that the TEG can tolerate (e.g., a zinc and copper alloy for 800° C. that TEG modules based on calcium Magnesium Oxides can tolerate). Thereby, as the temperature of the protruding members 31 rises well above the high temperature limit of the TEG modules, the phase-change material 27 would absorb the heat and when its temperature reaches the material melting point, it begin to melt, absorbing heat at its constant melting temperature.

Once the phase-change material 27 in the filled container 26 has been melted, the temperature of the at least one passive bi-metal (shape memory or the like) actuator 32 begins to rise. Once the temperature of the passive bi-metal actuator 32 has reached a preset threshold, the actuator is designed to displace the intermediate plate 28 and thereby the containers 26 upward as viewed in the schematic of FIG. 11 and thereby creating a gap between the sloped surfaces of the protruding members 31 and the containers 26, which the intermediate plate 28 stays in contact with the TEG modules 33 as shown in the schematic of FIG. 11. Thus, lowing the rate at which heat energy is transmitted from the plate 29 to the containers 26 and thereby the phase change material 27. In this state of the TEGS, heat is primarily transmitted to the container 26 via radiation, while heat energy is still being transmitted to the TEG modules 33 via conduction.

As a result, by proper design of the latter "high-temperature protection mechanism" of the TEGS, the temperature of the hot side of the TEG modules of the TEGS can be kept close to the predetermined optimal temperature, usually the maximum allowable temperature for the TEG type being used, during nearly the entire duration of the operational cycle of the TEGS.

The TEGS of FIG. 11 may be attached to the plate 29, which is exposed to the high temperature heat flux 30, by the cover member 37, by fasteners 36 or other methods known in the art. Steps 35 or other similar support members may be provided on the plate 29 so that the intermediate plate 28 could freely slide over them as being pushed by the passive bi-metal or the like actuator(s) 32.

As can be seen in the schematic of the FIG. 11, on the cold side of the thermoelectric generator modules 33, containers 38, filled with (phase changing) materials 34, are still provided and are designed to function as was previously described for the embodiment of FIG. 7. Thus, by the proper design of the passive bi-metal (shape memory or the like) actuators 32 and sizing of the volumes of the phase-change materials 27 and 34, FIG. 11, the thermoelectric generator modules 33 are subjected to a nearly constant and predetermined temperature gradient during a significant, if not most, of the operating cycle of the TEGS. As a result, a highly predictable and reliable power source is provided that is not sensitive to the unavoidable input temperature and heat flux 30 variations.

It is also appreciated that once the input temperature and heat flux 30, FIG. 11, has dropped below the optimal hot side temperature of the TEG modules 33, the temperature of the molten phase-change material 27 stays constant due to the latent heat of melting of the material for a considerable amount of time. As a result, while the molten phase-change material 27 on the hot side of the TEG modules 33 is cooling and solidifying, the temperature gradient across the TEG modules stays at its optimal level and the TEG modules 33 would generate their designed level of electrical energy.

In the TEGS embodiment of FIG. 11, a passive actuator (a bi-metal, shape memory or the like type) is shown to be used for displacing the intermediate plate 28 after the phase changing materials 27 has melted and the containers 26 have reached a certain preset temperature. It is appreciated by those skilled in the art that in general the use of properly designed passive bi-metal actuator(s) is more advantageous since they can be designed to continuously displace the intermediate plate 28, thereby continuously increase the gap between the sloped surfaces of the protruding members 31 and the containers 26 as the temperature of the containers is increased and reverse the process once the container temperature drops below the set threshold.

In the TEGS embodiment of FIG. 11, a passive actuator (a bi-metal, shape memory or the like type) is shown to be used for displacing the intermediate plate 28 after the phase changing materials 27 has melted and the containers 26 have reached a certain preset temperature. Alternatively, an active actuator such as an electrical linear (like a solenoid) or rotary actuator (not shown) may be used in place of the passive actuator 32, FIG. 11. A temperature sensor (not shown) may then be used to measure the temperature on the hot side of the TEG modules 33 to control the displacement of the intermediate plate 28, thereby the gap between the sloped surfaces of the protruding members 31 and the containers 26 to keep the temperature on the hot side of the TEG modules 33 nearly constant.

In the TEGS embodiment of FIG. 11, a passive actuator (a bi-metal, shape memory or the like type) is shown to be used for displacing the intermediate plate 28 after the phase changing materials 27 has melted and the containers 26 have reached a certain preset temperature. In another TEGS embodiment 40 shown in the schematic of FIG. 13, the assembly of the TEG modules and the phase changing material filled containers on the hot and cold side of the TEG modules is displaced towards and away from the plate that is exposed to the hot temperature heat flux using passive or active actuation mechanisms to achieve the desired temperature gradient across the TEG modules of the TEGS device.

Figure 13:
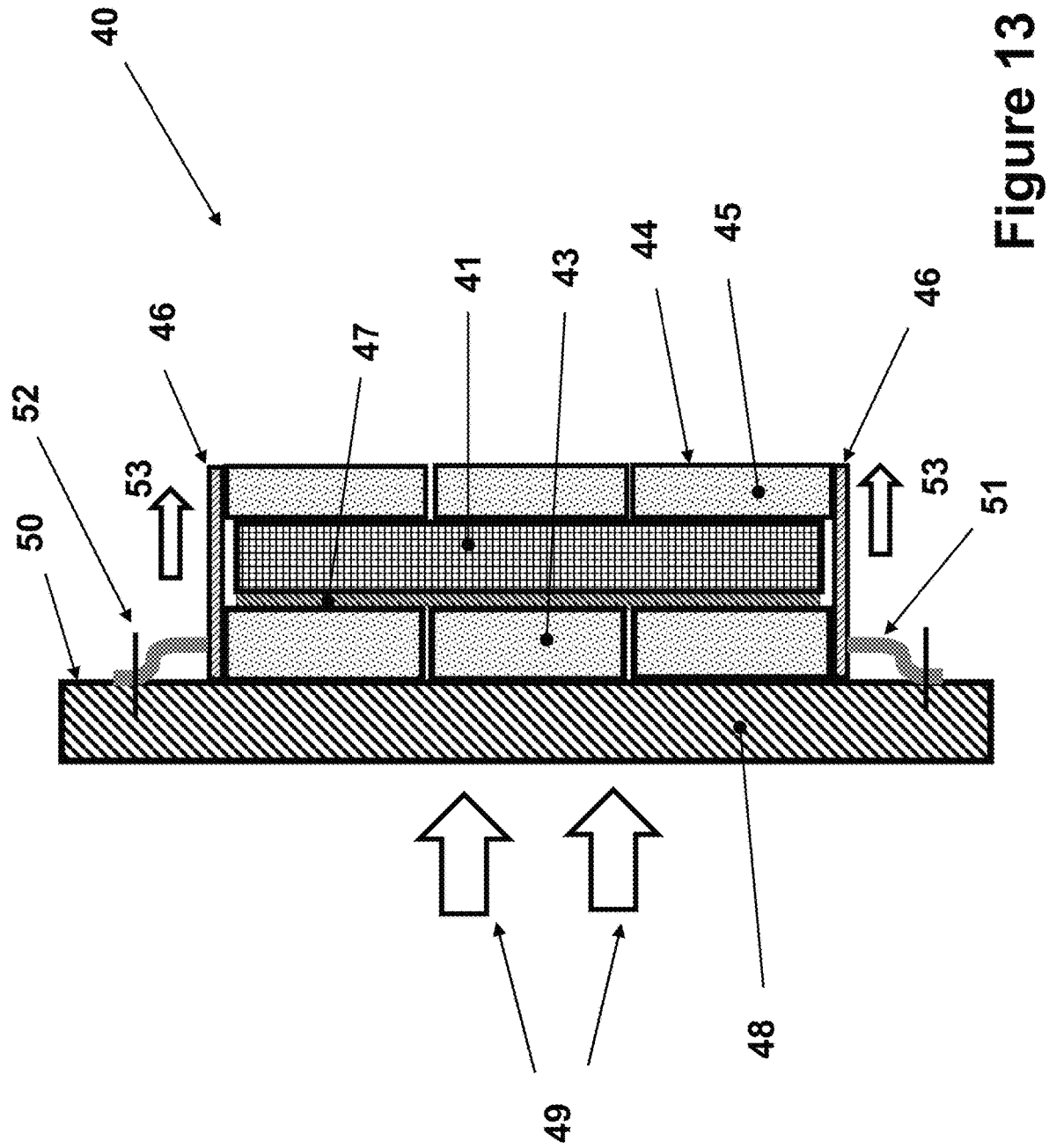
FIG. 13 illustrates the details of a second embodiment of Thermoelectric Generator System (TEGS) as attached to a high temperature and high heat flux surface.

One advantage of using active actuation mechanism in the TEGS embodiments of FIGS. 11 and 13 and other embodiments of the present inventions is that they TEGS may be provided with temperature sensors and the measured temperature on the hot side and even the cols side of the system TEG modules can be used to optimally control the gap between the phase changing filled containers on the hot side of the TEG modules and the plate through which high temperature heat flux is transmitted to the containers via primarily conduction and/or radiation. The disadvantage of active mechanisms such as electric motors and solenoids is that they occupy space and make TEGS large and also that they consume part of the generated electrical energy and pose high temperature operational issues with the required wirings and electronics.

Figure 14:
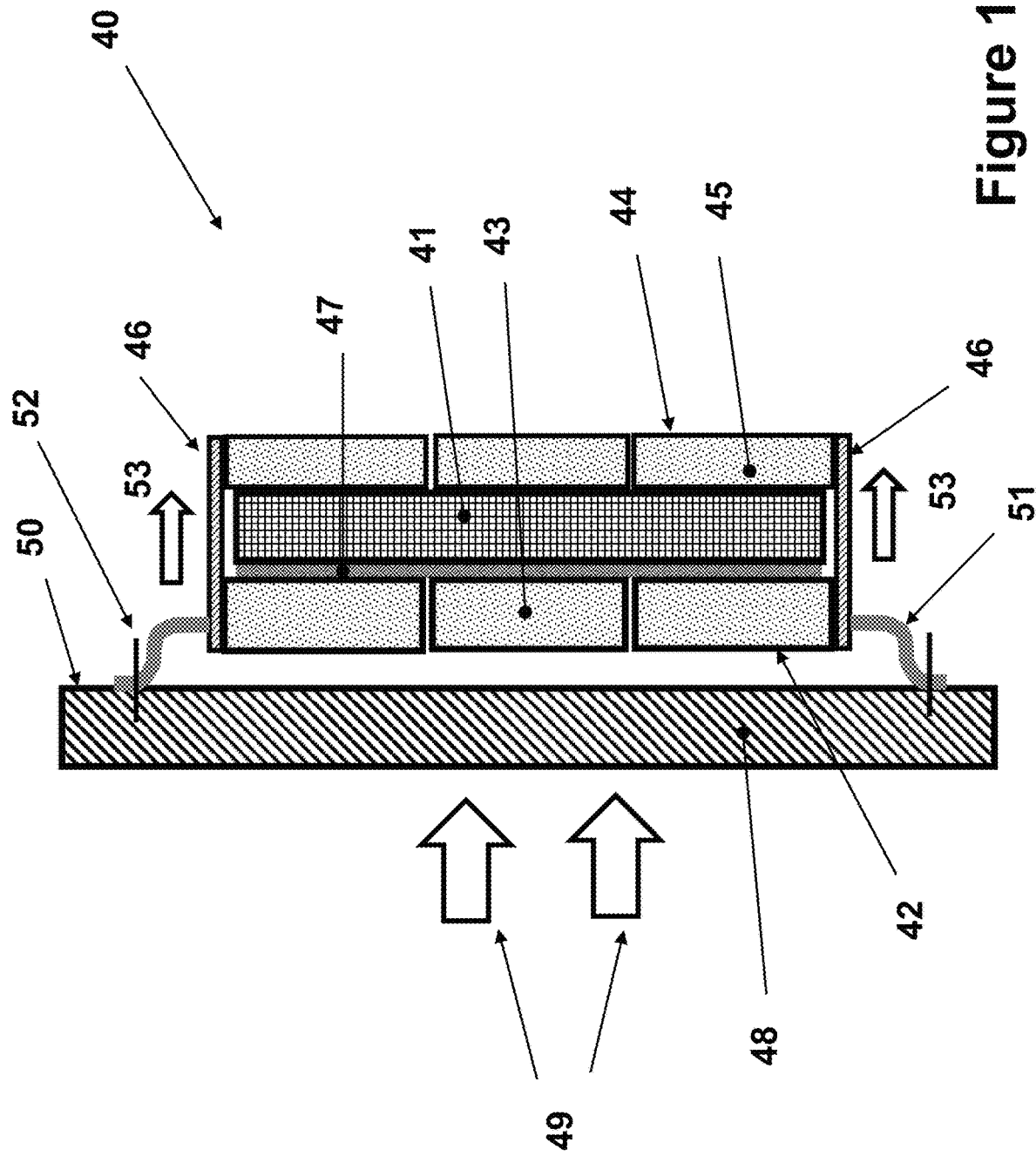
FIG. 14 illustrates the TEGS embodiment of FIG. 13 with components configuration following displacement of the TEG module and phase change material container assembly away from the high temperature and high heat flux surface.

The TEGS embodiment 40 of FIG. 13 consists of an assembly of TEG modules 41, on the high temperature side of which are provided at least one sealed container 42, FIG. 14, that is filled with a phase change material 43 that is designed to melt at a prescribed high temperature limit that the TEG can tolerate (e.g., a zinc and copper alloy for 800° C. that TEG modules based on calcium Magnesium Oxides can tolerate). On the cold side of the TEG modules 41, sealed containers 44 are provided that are filled with phase changing materials 45, which is selected to have a lower melting temperature (for example, tin which melts at 230° C.). A relatively thin plate 47 with high thermal conductivity, such as copper, may be provided between the containers 42 and the TEG modules 41 to improve temperature uniformity over the TEG module surface. A similar thin plate (nor shown) may also be provided for the same purpose between the containers 44 and the TEG modules 41. The above components of the TEGS embodiment 40 are assembled within the side structure 46.

The TEGS embodiment 40 of FIG. 13 is attached to the side 50 of the plate 48 by passive bi-metal (shape memory or the like) actuators 51 by fasteners 52 or other methods known in the art. The actuators are attached to the structure 46 of the TEGS embodiment 40. The plate 48 is subjected to the high temperature heat flux as shown by the arrows 49 in FIG. 13. In the configuration shown in FIG. 13, the containers 42 (FIG. 14) are in contact with the surface 50 side of the plate 48. In this configuration, the provided passive bi-metal or shape memory or the like actuators 51 keep the containers 43 in contact with the surfaces 50 of the plate 48.

The operation of the modified TEGS embodiment 40 of FIG. 13 is similar to that of the TEGS embodiment of FIG. 7. Prior to TEGS exposure to high temperature heat flux 49, the sealed containers 42, FIG. 14, filled with the solid phase-change material 43 are normally pressed against the surface 50 of the heat flux exposed plate 48. Once the TEGS is exposed to the high temperature heat flux 49, as the temperature of the plate 48 rises, heat is transmitted to the containers 42 and to its filled solid phase-change material 43 and through conduction to the TEG modules 41 (via the intermediate plate 47 if provided).

The phase-change material 43 is also designed to melt at a prescribed high temperature limit that the TEG can tolerate (e.g., a zinc and copper alloy for 800° C. that TEG modules based on calcium Magnesium Oxides can tolerate). Thereby, as the temperature of the plate 48 rises well above the high temperature limit of the TEG modules, the phase-change material 43 would absorb the heat and when its temperature reaches the material melting point, it begin to melt, absorbing heat at its constant melting temperature.

Once the phase-change materials 43 in the filled containers 42 are melted, the temperature of the passive bi-metal (shape memory or the like) actuators 51 continue to rise.

Once the temperature of the passive bi-metal actuators 51 has reached a preset threshold, the actuators are designed to move the TEGS assembly 40 away from the plate 48 in the direction of the arrows 53 as shown in FIG. 14, thereby creating a gap between the surface 50 of the plate 48 and the containers 48. Thus, lowing the rate at which heat energy is transmitted from the plate 48 to the containers 42 and thereby the phase change material 43. In this state of the TEGS embodiment 40, heat is primarily transmitted to the containers 42 via radiation, while heat energy is being transmitted to the TEG modules 41 via conduction.

As a result, by proper design of the described "high-temperature protection mechanism" of the TEGS, the temperature of the hot side of the TEG modules of the TEGS can be kept close to the predetermined optimal temperature, usually the maximum allowable temperature for the TEG type being used, during nearly the entire duration of the operational cycle of the TEGS.

As can be seen in the schematic of the FIG. 13, on the cold side of the thermoelectric generator modules, containers 44, filled with (phase changing) materials 45, are still provided and are designed to function as was previously described for the embodiment of FIG. 7. Thus, by the proper design of the passive bi-metal (shape memory or the like) actuators 51 and sizing of the volumes of the phase-change material 43 and 45, FIG. 13, the thermoelectric generator modules 41 are subjected to a nearly constant and predetermined temperature gradient during a significant, if not most, of the operating cycle of the TEGS. As a result, a highly efficient, predictable and reliable power source is provided that is not sensitive to the unavoidable input temperature and heat flux 49 variations.

It is also appreciated that once the input temperature and heat flux 49, FIG. 13, has dropped below the optimal hot side temperature of the TEG modules 41, the temperature of the molten phase-change material 43 stays constant due to the latent heat of melting of the material for a considerable amount of time. As a result, while the molten phase-change material 43 on the hot side of the TEG modules 41 is cooling and solidifying, the temperature gradient across the TEG modules stays at its optimal level and the TEG modules 41 would generate their designed level of electrical energy.

In the TEGS embodiment of FIG. 13, the phase changing materials 43 on the hot side of the TEG modules 41 are stored in more than one container 42 (FIG. 14). However, it is appreciated that a single container 42 may also be used. The advantages of using smaller containers 42 include the ease of manufacture and the use of lighter container material to prevent excessive deformation during the heating and cooling cycles and prevention of uneven melting patterns. The phase changing materials 45 on the cold side of the TEG modules 41 may also be stored in fewer containers 44, even a single container, while temperature variation effects being less pronounced on these containers due to their lower levels.

It is also appreciated by those skilled in the art that the phase changing material containers of all the disclosed the embodiments of the present invention may also be stored in fewer number of containers, while considering the aforementioned advantages of using multiple containers.

It is however, appreciated by those skilled in the art that the use of multiple phase changing material sealed enclosures on both hot and cold sides TEG modules also has the advantage of being able to readily design TEGSs for attachment to non-flat heated surfaces such as the interior surfaces of a cylindrical body, such as a supersonic projectile, or the exterior surfaces of a cylindrical body, such as a boiler or furnace. Multiple smaller surface phase changing material containers also prevents the effects of gravity or object acceleration to collect the solid portion of a melting material on one side of the container, thereby causing a nonuniform temperature distribution to be formed on the surfaces of TEG modules.

In certain applications, the TEGS may be exposed to very short duration high temperature heat fluxes that may or may not be repeating, but with long enough separation to allow the TEGS to return to its initial pre-heat flux state. In such applications, in the TEGS embodiments of FIGS. 7, 9, 13 and even 11 the phase changing material on the cold side of the TEG modules may be eliminated if the heat can pass through the TEG modules without raising the temperature of the environment on the cold side of the TEG modules a significant amount during each short duration high temperature heat flux cycle.

It is also appreciated by those skilled in the art that in some applications, the TEGS may be exposed to high temperature and high heat fluxes that vary significantly over time. This may, for example be the case in a burner of a boiler or furnace that turned on and off periodically to keep the temperature of the boiler or furnace at a set temperature. In such applications, the phase change material filled containers may be directly exposed to the high temperature heat flux. The resulting TEGS must, however, be designed such that the system TEG modules are not exposed to temperatures that are higher than they can tolerate.

Figure 15:
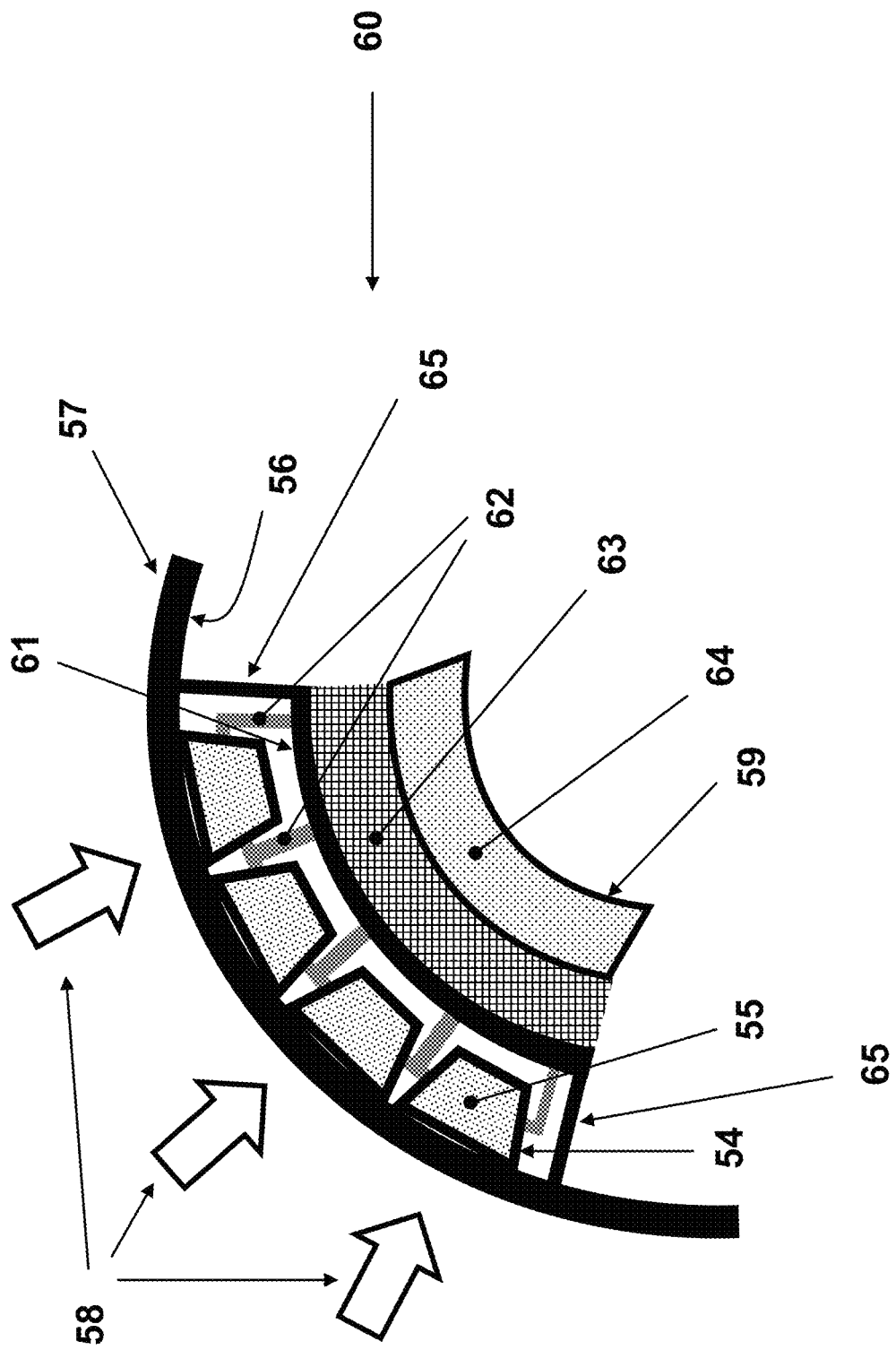
FIG. 15 illustrates the application of the TEGS embodiment of FIG. 7 inside the nose region of a supersonic projectile.

In the TEGS embodiments of FIGS. 7, 9, 11 and 13, the plate exposed to the high temperature flux (e.g., plate 14 in FIG. 7) is shown to be flat. However, it is appreciated by those skilled in the art that the said plat may have any surface shape, including being of a cylindrical shape. This feature of the disclosed embodiments makes then particularly suitable for use in supersonic projectiles in which leading edges of the projectile, such as the projectile nose, is subjected to high temperature and high flux heat. As an example, FIG. 15 shown the application of the TEGS embodiment of FIG. 7 to the typically curved cylindrical inner surfaces of a supersonic projectile. It is appreciated that the TEGS embodiment of FIGS. 9, 11 and 13 may also be similarly adapted for such application.

Similar to the TEGS embodiment of FIG. 7, the TEGS embodiment 60 of FIG. 15 is constructed with sealed containers 54 (15 in FIG. 7), which are filled with a material 55 (16 in FIG. 7) that is designed to melt (phase change) at a desired temperature. The sealed containers 54 are normally in contact with the inside surface 56 (11 in FIG. 6) of the outer housing 57 (14 in FIG. 7) of the leading edge of a supersonic projectile (not shown).

The casing of the container 54 is also selected to ensure that it could withstand the high temperatures of the heat influx 58. For example, the casing of the container 54 may be made out of stainless steel and the filling phase-changing material be made out of an aluminum alloy with a melting temperature of 500° C. or zinc or tin, with melting temperatures of 420° C. and 230° C., respectively.

The sealed containers 54 are connected to a base intermediate plate 61 (17 in FIG. 7) via passive thermal actuators 62 (18 in FIG. 7) as shown in FIG. 15. The intermediate plate 62 may in turn be rigidly attached to the inner surface 56 of the projectile housing 57 by the side structures 65. The passive actuators 62 may be constructed as well-known bi-metal devices or be a shape-memory based actuation device that is designed to retract the sealed containers 54 away from the plate 57 when they reach a prescribed temperature. This configuration of the TEGS is shown in the schematic of FIG. 15. Thereby, a prescribed distance is provided between the containers 54 and the inner surface 56, FIG. 16, of the plate 57, thereby reducing the amount of heat that is transmitted from it to the containers 54. It is appreciated that by providing the said gap between the containers 54 and the inner surface 56 of the plate 57, the mode of heat transfer from the plate 57 to the containers 54 becomes mainly through radiation with minimal direct conduction.

The hot side of the thermoelectric generator modules 63 are then attached to intermediate plate 61 as shown in FIG. 15. On the cold side of the thermoelectric generator modules, containers 59 are provided, which are filled with (phase changing) materials 64 with lower melting temperature than those of the material 55. In the TEGS embodiment 60 of the present invention, the difference between the melting temperatures of the materials 55 and 64 of the sealed containers 54 and 59, respectively, is to provide the desired temperature gradient across the thermoelectric generator modules 63 as described later in this disclosure.

It is appreciated by those skilled in the art that the reason for constraining the phase changing materials 55 and 64 in sealed containers 54 and 59, respectively, is so that following melting, the melted material does not flow away and keep on absorbing heat energy without an increase in their temperatures.

Figure 16:
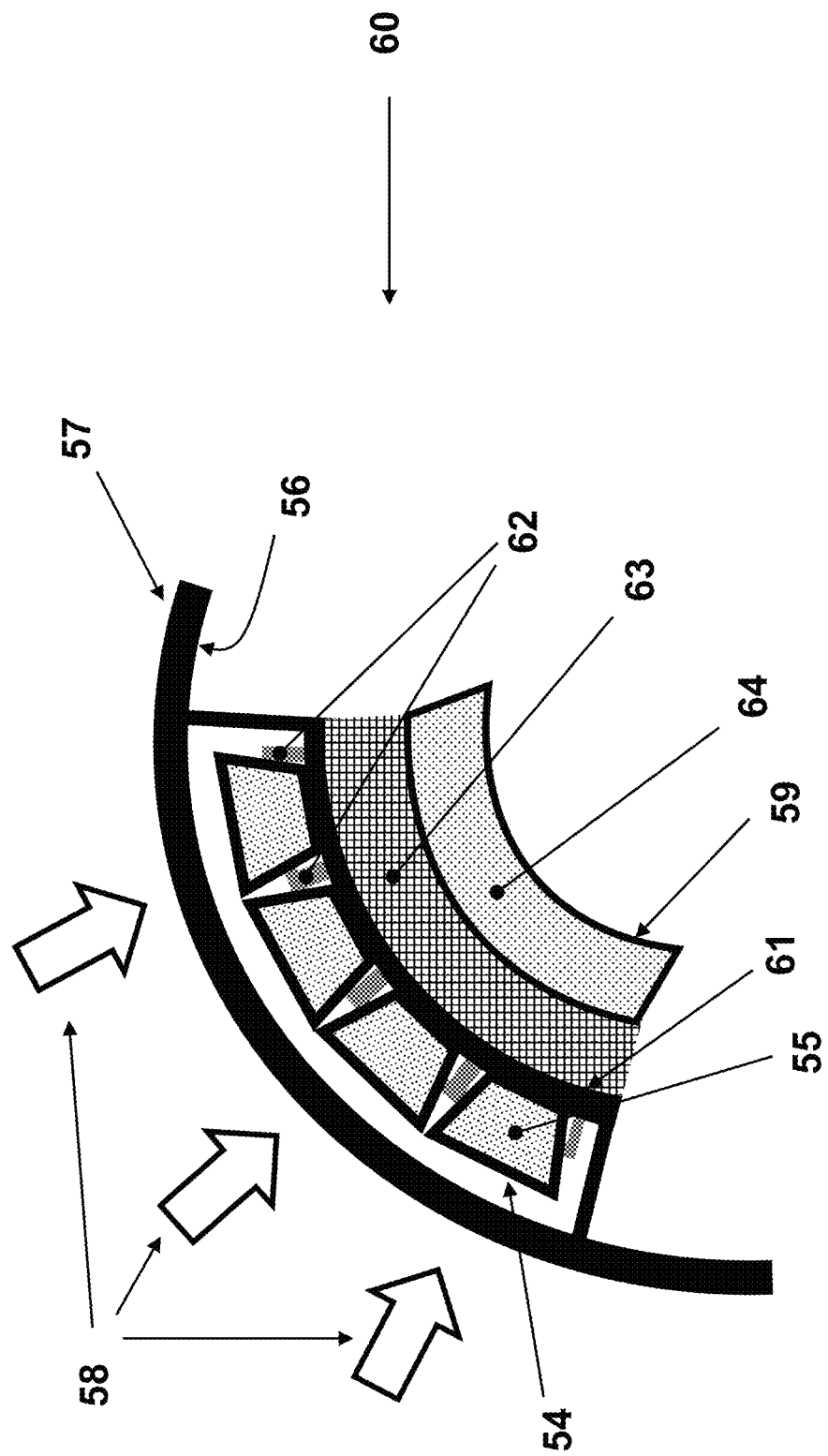
FIG. 16 illustrates the TEGS embodiment of FIG. 15 with components configuration following displacement of the TEG module and phase change material container assembly away from the high temperature and high heat flux surface.

In the TEGS embodiment 60 of FIGS. 15-16, the function of the phase change material 55 filled sealed containers 54 and the passive actuation devices 62 (bimetal or shape memory or the like) is to protect the thermoelectric generator modules 63 of the TEGS from temperatures higher than what they can tolerate. Such assemblies constitute the aforementioned "high-temperature protection mechanisms" for the TEG modules.

It is appreciated that the heat flux entering the hot side of the TEG modules is partially converted to electrical energy by the TEG modules (with most currently available TEG modules, usually less than 10% is converted to electrical energy) and the remainder is passed through, in the case of the TEGS of FIG. 15, to the containers 59 and thereby to the filling phase changing materials 64 (for example, tin at 230° C.), which is selected to have a lower melting temperature than the material 55. Then as the materials 64 begins to melt, it keeps on absorbing heat at its constant melting and molten temperature. As a result, while the phase changing materials 55 and 64 are in molten phase, their temperatures are constant and thereby a constant temperature gradient is applied across the TEG modules 63 of the TEGS.

Therefore, by the proper design of the bi-metal (shape memory or the like) actuators 62 and sizing of the volumes of the phase-change material 55 and 64, FIG. 15, the thermoelectric generator modules 63 are subjected to a nearly constant and predetermined temperature gradient during a significant, if not most, of the supersonic projectile (or the like) of the TEGS. As a result, a highly predictable and reliable power source is provided that is not sensitive to the unavoidable input temperature and heat flux 58 variations.

It is also appreciated that once the input temperature and heat flux 58, FIG. 15, has dropped below the optimal hot side temperature of the TEG modules 63, the temperature of the molten phase-change material 55 stays constant due to the latent heat of melting of the material for a considerable amount of time. As a result, while the molten phase-change material 55 on the hot side of the TEG modules 63 is cooling and solidifying, the temperature gradient across the TEG modules stays at its optimal level and the TEG modules 63 would generate their designed level of electrical energy.

In the TEGS embodiment 60 of FIG. 15, the containers 54 of the phase change material 55 is initially in contact with the inner surface 56 of the plate 57 and transfers heat to the intermediate plate 61 and thereby the TEG modules 63 mainly though radiation and then when it is heated to the prescribed temperature, the container 54 is pulled back and comes into contact with the intermediate plate 61, beginning to transfer heat to the plate 61 and thereby the TEG modules 63 mainly via conduction.

It is appreciated by those skilled in the art that many supersonic munitions are launched at high Mach speeds and their speed drop later during the flight. In such applications, the TEGS embodiment 60 of FIG. 15 has the advantage of using the stored heat energy in its phase changing material 55 on the hot side of the TEG modules 63 to keep on providing electrical energy at peak levels and serve as a reliable and predictable source of power for a significant amount of time until the phase changing material 55 has solidified, which by proper selection of the phase changing material and its volume could cover the entire flight time of the supersonic projectile.

The TEGS embodiment 60 of FIG. 15 is particularly suitable for addressing unique characteristics of the high Mach speed projectiles as described previously since it enables optimal harvesting of the input heat energy from leading surfaces of the projectile and its conversion to electrical energy in a predictable and reliable process, while providing thermal protection for interior heat sensitive components of the projectile.

In the TEGS embodiment 60 of FIG. 15, the TEGS embodiment 10 of FIG. 7 was shown to be adapted for use on curved surfaces, such as the nose area of a supersonic projectile or the cylindrical outer surfaces of a hot tube, or any other similar curved surfaces. It is appreciated by those skilled in the art that the TEGS embodiment of FIG. 9 can also be similarly adapted for use on similar curves surfaces. One advantage of the latter embodiment is that in this embodiment, the phase changing material filled containers 23 on the hot side of the TEG modules are fixedly attached to the intermediate plate 17, with which the TEG modules 19 are always in contact. Thereby, heat is continuously conducted to the TEG modules via conduction.

Figure 17:
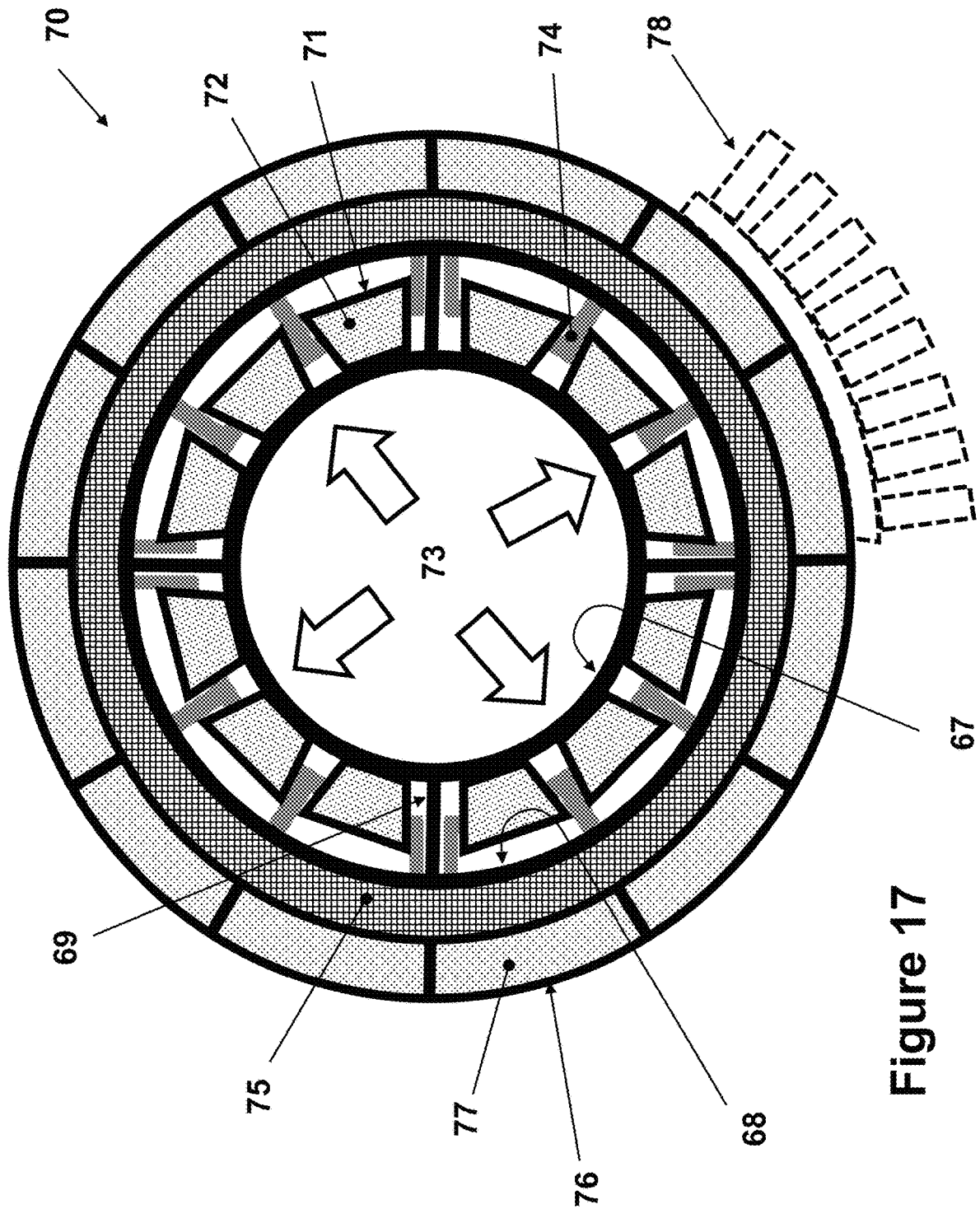
FIG. 17 illustrates the application of the TEGS embodiment of FIG. 15 to the outside surface of a cylindrical pipe with internal high temperature heat source.

In the TEGS embodiment 60 of FIG. 15, the TEGS is attached to the inside surface of an object, such as a supersonic projectile or on the inside surface of a pipe that is externally exposed to a high temperature heat flux. It is appreciated that this and other embodiments of the present invention may be similarly attached to the interior or exterior surfaces of various devices and systems with or without curved surfaces. As an example, the implementation of the TEGS embodiment 60 on the outer surfaces of a cylindrical pipe with internal high temperature heating source, such as a pipe through which high temperature air or steam is passing, is shown in the schematic of FIG. 17. It is appreciated that the TEGS may cover the entire outer surface of the cylindrical tube as shown in FIG. 17 or a portion of its peripheral surface. It is appreciated that the TEGS embodiment of FIGS. 9, 11 and 13 may also be similarly adapted for such application.

In the schematic of FIG. 17, the TEGS embodiment 70 is attached to the outside surface 66 (FIG. 18) of the cylindrical tube 67. Similar to the TEGS embodiment of FIG. 15, the TEGS embodiment 70 of FIG. 15 is constructed with sealed containers 71, which are filled with a material 72 that is designed to melt (phase change) at a desired temperature. The sealed containers 71 are normally in contact with the outside surface (FIG. 18) of the outer cylindrical tube 67.

The casings of the containers 71 are also selected to ensure that they can withstand the high temperatures of the heat influx 73 from the inside of the tube 67. For example, the casings of the container 71 may be made out of stainless steel and the filling phase-changing material be made out of an aluminum alloy with a melting temperature of 500° C. or zinc or tin, with melting temperatures of 420° C. and 230° C., respectively.

Figure 18:
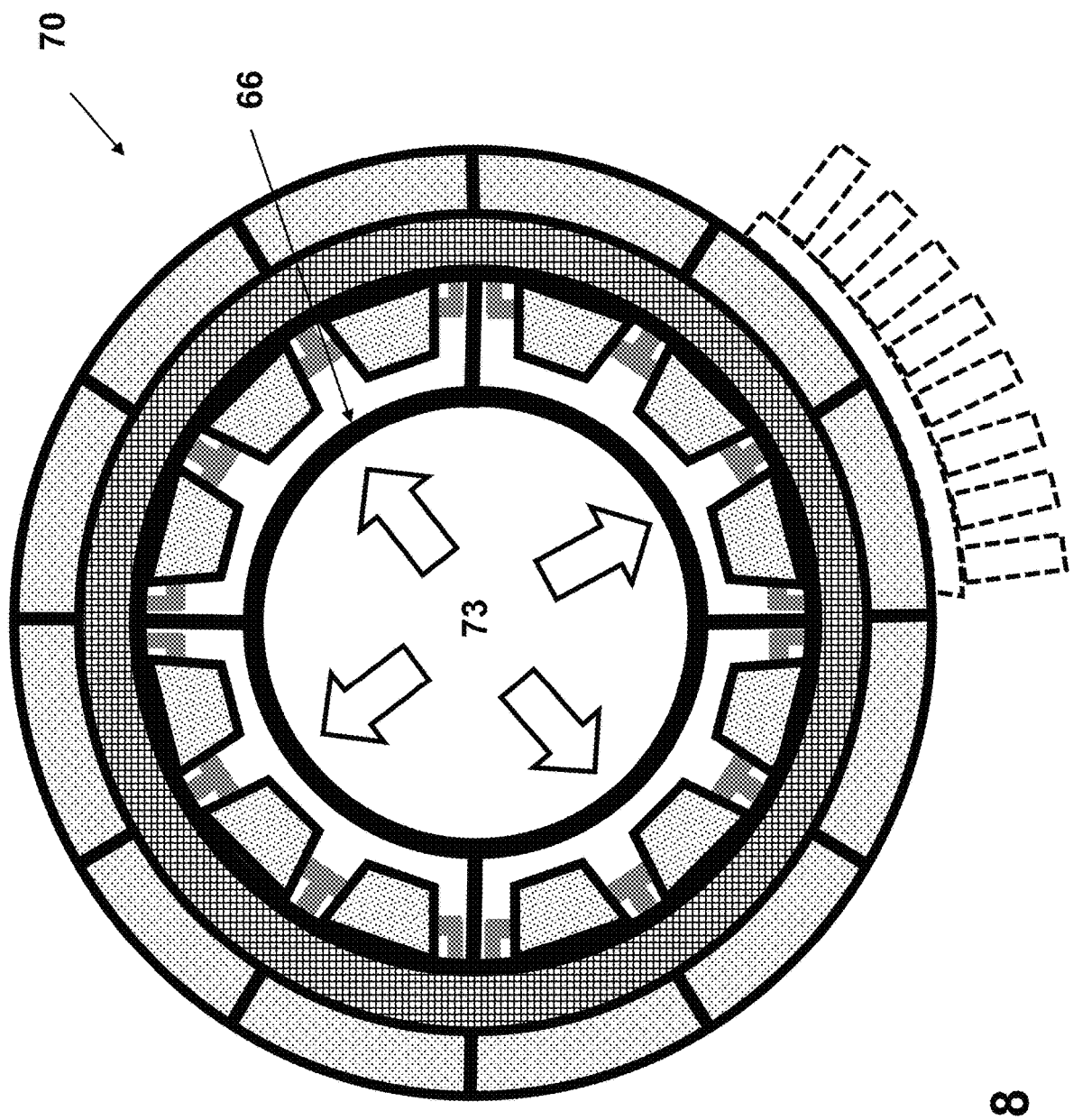
FIG. 18 illustrates the TEGS embodiment of FIG. 15 with components configuration following displacement of the TEG module and phase change material container assembly away from the high temperature and high heat flux surface.

The sealed containers 71 are connected to an intermediate tube 68 via passive thermal actuators 62 as shown in FIG. 15. The intermediate tube 68 is in turn is rigidly attached to the outer surface 66 of the cylindrical tube 67 by the web structures 69. The passive actuators 74 may be constructed as well-known bi-metal devices or be a shape-memory based actuation device that is designed to retract the sealed containers 71 away from the cylindrical tube 67 when they reach a prescribed temperature. This configuration of the TEGS is shown in the schematic of FIG. 18. Thereby, a prescribed distance is provided between the containers 71 and the outer surface 66, FIG. 18, of the tube 67, thereby reducing the amount of heat that is transmitted from it to the containers 71. It is appreciated that by providing the said gap between the containers 71 and the outer surface 66 of the tube 67, the mode of heat transfer from the tube 67 to the containers 71 becomes mainly through radiation with minimal direct conduction.

The hot side of the thermoelectric generator modules 75 are then attached to intermediate tube 68 as shown in FIG. 17. On the cold side of the thermoelectric generator modules 75, containers 76 are provided, which are filled with (phase changing) materials 77 with lower melting temperature than those of the material 72. In the TEGS embodiment 70 of the present invention, the difference between the melting temperatures of the materials 72 and 77 of the sealed containers 71 and 76, respectively, is to provide the desired temperature gradient across the thermoelectric generator modules 75 as described later in this disclosure.

It is appreciated by those skilled in the art that the reason for constraining the phase changing materials 72 and 77 in sealed containers 71 and 76, respectively, is so that following melting, the melted material does not flow away and keep on absorbing heat energy without an increase in their temperatures.

In the TEGS embodiment 70 of FIGS. 17-18, the function of the phase change material 72 filled sealed containers 71 and the passive actuation devices 74 (bimetal or shape memory or the like) is to protect the thermoelectric generator modules 75 of the TEGS from temperatures higher than what they can tolerate. Such assemblies constitute the aforementioned "high-temperature protection mechanisms" for the TEG modules.

It is appreciated that the heat flux entering the hot side of the TEG modules is partially converted to electrical energy by the TEG modules (with most currently available TEG modules, usually less than 10% is converted to electrical energy) and the remainder is passed through, in the case of the TEGS of FIG. 17, to the containers 76 and thereby to the filling phase changing materials 77 (for example, tin at 230° C.), which is selected to have a lower melting temperature than the material 5725. Then as the materials 77 begins to melt, it keeps on absorbing heat at its constant melting and molten temperature. As a result, while the phase changing materials 72 and 77 are in molten phase, their temperatures are constant and thereby a constant temperature gradient is applied across the TEG modules 75 of the TEGS.

Therefore, by the proper design of the bi-metal (shape memory or the like) actuators 74 and sizing of the volumes of the phase-change material 72 and 77, FIG. 17, the thermoelectric generator modules 76 are subjected to a nearly constant and predetermined temperature gradient. As a result, a highly predictable and reliable power source is provided that is minimally sensitive to the unavoidable input temperature and heat flux 73 variations.

It is also appreciated by those skilled in the art that since currently available TEG modules can only convert a relatively small portion of the heat flux energy into electrical energy, usually a maximum of 5-10 percent, then if the high temperature heat flux is present over extended periods of time, then the remaining heat has to be discarded from the containers 76 to the outside environment. To facilitate this transfer of heat, the exterior surface area of the containers 76 may be increased, for example by the addition of fins 78 (only a portion of which is shown in FIG. 17 in dashed lines). It is appreciated that similar cooling fins may be provided on the surfaces of other cold side members of the other embodiments of the present invention. In addition, multi-stage TEGS described later in this disclosure may be used to convert a larger portion of the heat flux to electrical energy.

It is also appreciated in applications in which high temperature heat flux 73 is provided once or repeatedly in relatively short durations, once the input temperature and heat flux 73, FIG. 17, has dropped below the optimal hot side temperature of the TEG modules 77, the temperature of the molten phase-change material 72 stays constant due to the latent heat of melting of the material for a considerable amount of time. As a result, while the molten phase-change material 72 on the hot side of the TEG modules 77 is cooling and solidifying, the temperature gradient across the TEG modules 75 stays at its optimal level and the TEG modules would generate their designed level of electrical energy.

In the TEGS embodiment 70 of FIG. 17, the containers 71 of the phase change material 72 is initially in contact with the outer surface 66 (FIG. 18) of the tube 67 and transfers heat to the intermediate tube 68 and thereby the TEG modules 75 mainly though radiation and then when it is heated to the prescribed temperature, the containers 71 are pulled back and come into contact with the intermediate tube 68, beginning to transfer heat to the intermediate tube 68 and thereby the TEG modules 75 mainly via conduction.

In the TEGS embodiment 70 of FIG. 17, the TEGS embodiment 60 of FIG. 15 was shown to be adapted for use on the outer curved surfaces, in this case a cylindrical tube. It is appreciated by those skilled in the art that the TEGS design of the embodiment of FIG. 17 may be similarly be attached on the outer surfaces of other systems such as boilers, exhaust of cars or trucks or furnaces, or the like. It is also appreciated that the other disclosed embodiments of the present invention may also be adapted for use on such other surfaces.

In addition, in the schematic of FIG. 17, the TEGS embodiment 70 is shown to cover the entire outer surface of the cylindrical tube 67. It is, however, appreciated by those skilled in the art that the TEGS embodiment 70 may also be used to cover a portion of the peripheral surface of the cylindrical tube 67.

It is appreciated by those skilled in the art that the TEGS embodiment of FIG. 9 can also be similarly adapted for use on the outer surface of the cylindrical tube 67 (FIG. 17) or other similar curves surfaces. One advantage of the embodiment of FIG. 9 is that in this embodiment, the phase changing material filled containers 23 on the hot side of the TEG modules 19 are fixedly attached to the intermediate plate 17, with which the TEG modules 19 are always in contact. Thereby, heat is continuously conducted to the TEG modules via conduction.

It is appreciated that since the currently available TEG modules can only convert a relatively small portion of the heat flux energy into electrical energy, usually a maximum of 5-10 percent, then if the high temperature heat flux is present over extended periods of time, then the remaining heat has to be discarded from the cold side of the TEG modules (e.g., 19 in FIG. 9) to the phase changing material (21 in FIG. 9) on the cold side of the TEG modules and from there to the environment (directly from the TEG modules to the environment if phase changing materials or other heat sink elements are not provided). Thus, by providing the properly selected material type and volume of phase change material layer (e.g., 21 in FIG. 9), the temperature of the phase change material can be effectively limited to its melting point temperature and be used to provide heat flow into a second layer (stage) of appropriately selected TEG modules for conversion to electrical energy, while the hot side temperature of the added TEG module layer is kept constant. As a result, a larger portion of the input heat flux energy (13 in FIG. 9) is converted to electrical energy and less heat is transmitted to the surrounding environment. It is appreciated that the second stage TEG modules may also be provided with a phase changing material layer with lower melting temperature than the one on the hot side of the second TEG modules. Such a two-stage TEGS constructed based on the TEGS embodiment of FIG. 9 is shown in the blow-up view of FIG. 19.

Figure 19:
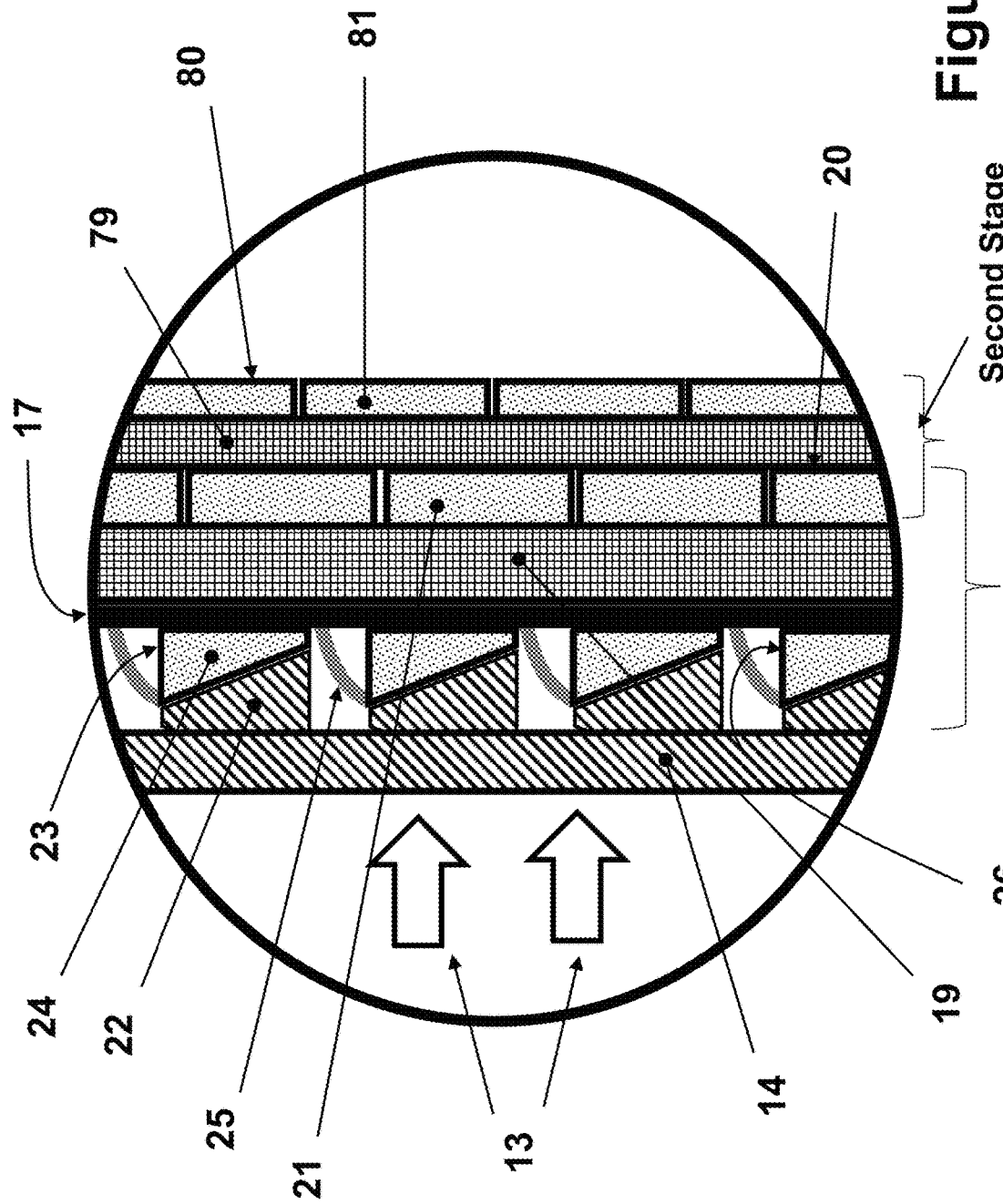
FIG. 19 illustrates a two-stage TEGS embodiment construction as would be viewed in the blow-up view "A" of FIG. 6.

In the blow-up view of FIG. 19, the TEGS of FIG. 9 is shown with the added second stage TEG modules 79 and containers 80 filled with the phase changing material 81. The melting temperature of the material 81 is lower than that of the material 21 to yield the desired temperature gradient across the TEG modules 79 at their constant melting states.

In most applications, only the first stage TEGS needs to be provided with the bi-metal actuated temperature control mechanism as shown in the schematic of FIG. 19. The second and any additional stages only need to use the cold side phase change material layer for the hot side of the next stage TEG and a phase change material layer with lower melting temperature on the cold side.

The operation of the TEGS embodiment of FIG. 19 is similar to that of the TEGS embodiment of FIG. 9. Prior to TEGS exposure to high temperature heat flux 13, the sealed containers 23 filled with the solid phase-change material 24 are normally pressed against the sloped surfaces of the protruding members 22 of the heat flux exposed plate 14. Once the TEGS is exposed to the high temperature heat flux 13, as the temperature of the plate 14 rises, heat is transmitted to the container 23 and to its filled solid phase-change material 24 and through conduction to the TEG modules 19 via the intermediate plate 17.

The phase-change material 24 is designed to melt at a prescribed high temperature limit that the TEG can tolerate (e.g., a zinc and copper alloy for 800° C. that TEG modules based on calcium Magnesium Oxides can tolerate). Thereby, as the temperature of the plate 14 rises well above the high temperature limit of the TEG modules, the phase-change material 24 would absorb the heat and when its temperature reaches the material melting point, it begin to melt, absorbing heat at its constant melting temperature.

Figure 20:
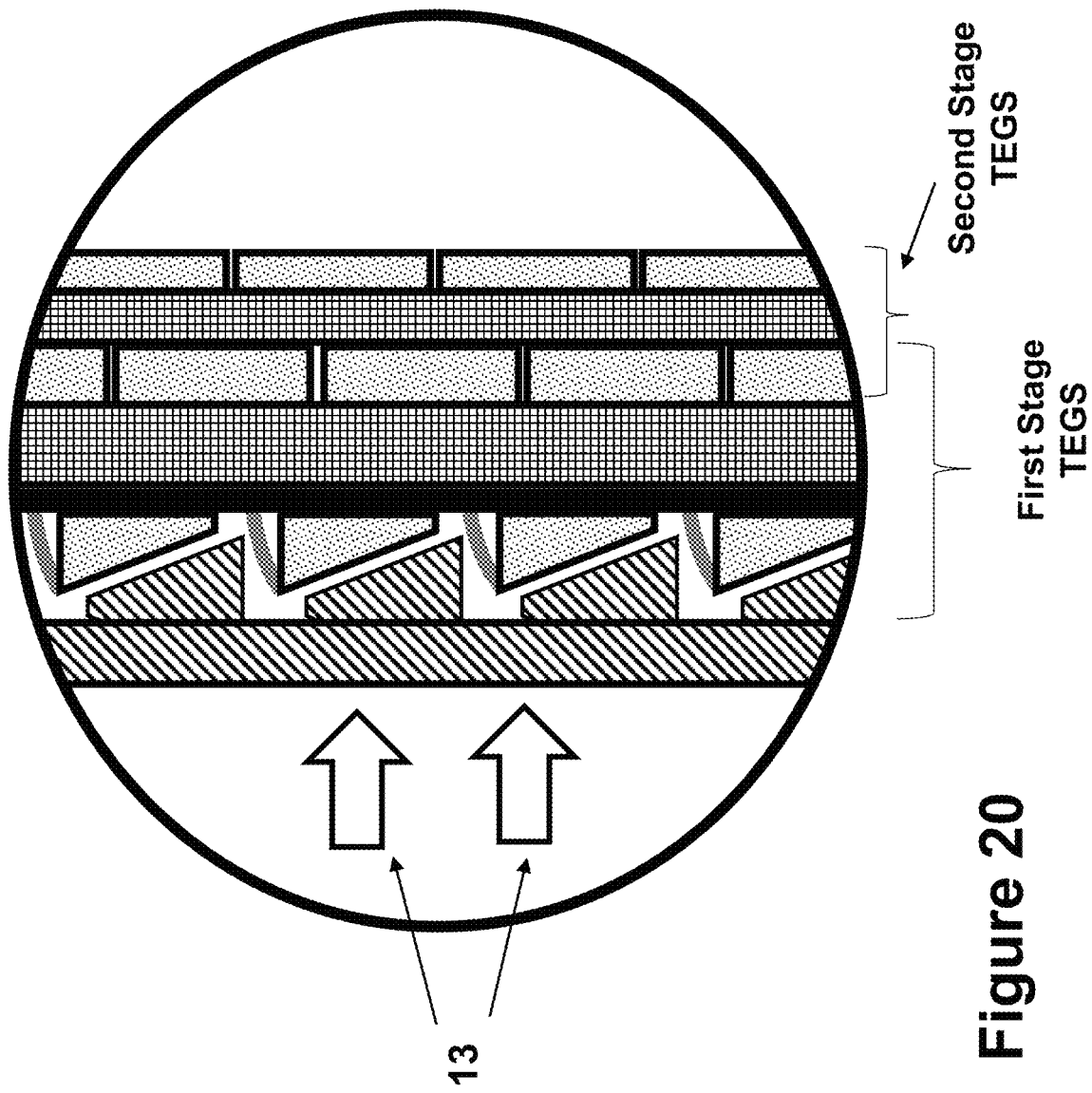
FIG. 20 illustrates the two-stage TEGS embodiment of FIG. 19 with the configuration of components following retraction of the phase change filled containers of the first stage by the provided passive actuators of the system.

Once the phase-change material 24 in the filled container 23 has been melted, the temperature of the passive bi-metal (shape memory or the like) actuators 25 begins to rise. Once the temperature of the passive bi-metal actuators 25 has reached a preset threshold, the actuators are designed to move the containers 23 upward as viewed in the schematic of FIG. 19 and thereby creating a gap between the sloped surfaces of the protruding members 22 and the containers 23, while the containers 23 are still in contact with the surface of the intermediate plate 17 as shown in the schematic of FIG. 20. Thus, lowing the rate at which heat energy is transmitted from the plate 14 to the containers 23 and thereby the phase change material 24. In this state of the TEGS, heat is primarily transmitted to the container 23 via radiation, while heat energy is still being transmitted to the TEG modules 19 via conduction.

Meanwhile, the portion of the heat energy passing through TEG modules 19 heats the phase changing materials 21 on the cold side of the TEG modules 19. By providing the properly selected phase change material 21, its temperature can be effectively limited to its melting point temperature. The second stage TEG modules 79 attached to the containers 20 of the phase changing material 21 is then subjected to the heat flux from the containers 20 on its hot side at the melting temperature of the material 21. The containers 80 with lower melting temperature material 81 will then provide the means of achieving a constant temperature gradient across the TEG modules 79, once enough heat has been absorbed by the material 81 to reach its melting temperature. As a result, a larger portion of the input heat flux energy 13 is converted to electrical energy and less heat is transmitted to the surrounding environment.

It is also appreciated that once the input temperature and heat flux 13, FIG. 19, has dropped below the optimal hot side temperature of the TEG modules 19, the temperature of the molten phase-change materials 24 and 21 stay constant due to the latent heat of melting of the materials for a considerable amount of time. As a result, while the molten phase-change material 24 on the hot side of the TEG modules 19 and the molten phase-change material 21 on the hot side of the TEG modules 79 are cooling and solidifying, the temperature gradients across the TEG modules 19 and 79 stay at their optimal level and the TEG modules 19 and 79 would generate their designed level of electrical energy.

It is appreciated by those skilled in the art that other layers of TEG modules and phase changing material containers (79 and 80, respectively in FIG. 19) may also be added to the two-stage TEGS of FIG. 19 to construct three-stage, four-stage, etc., TEGs. It is also appreciated by those skilled in the art that all disclosed embodiments of the present invention may be similarly be constructed as two or more stage TEGS.

It is appreciated that the function of the generated gaps between the phase changing material containers (e.g., containers 42 with phase changing materials 43 in FIG. 14) and the high temperature heat flux source (the surface 50 of the plate 48 in FIG. 14) is to control the amount of transmitted heat to the phase changing materials so that its temperature does not exceed its melting temperature. It is appreciated by those skilled in the art that the heat flow control can also be controlled by passively or actively deploying a shield between the heat source and the phase changing material container (or the heat source and TEG modules if no phase changing materials is provided). Such a TEGS embodiment 85 with a heat input control that is passively or actively actuated is shown in the schematic of FIG. 21.

Figure 21:
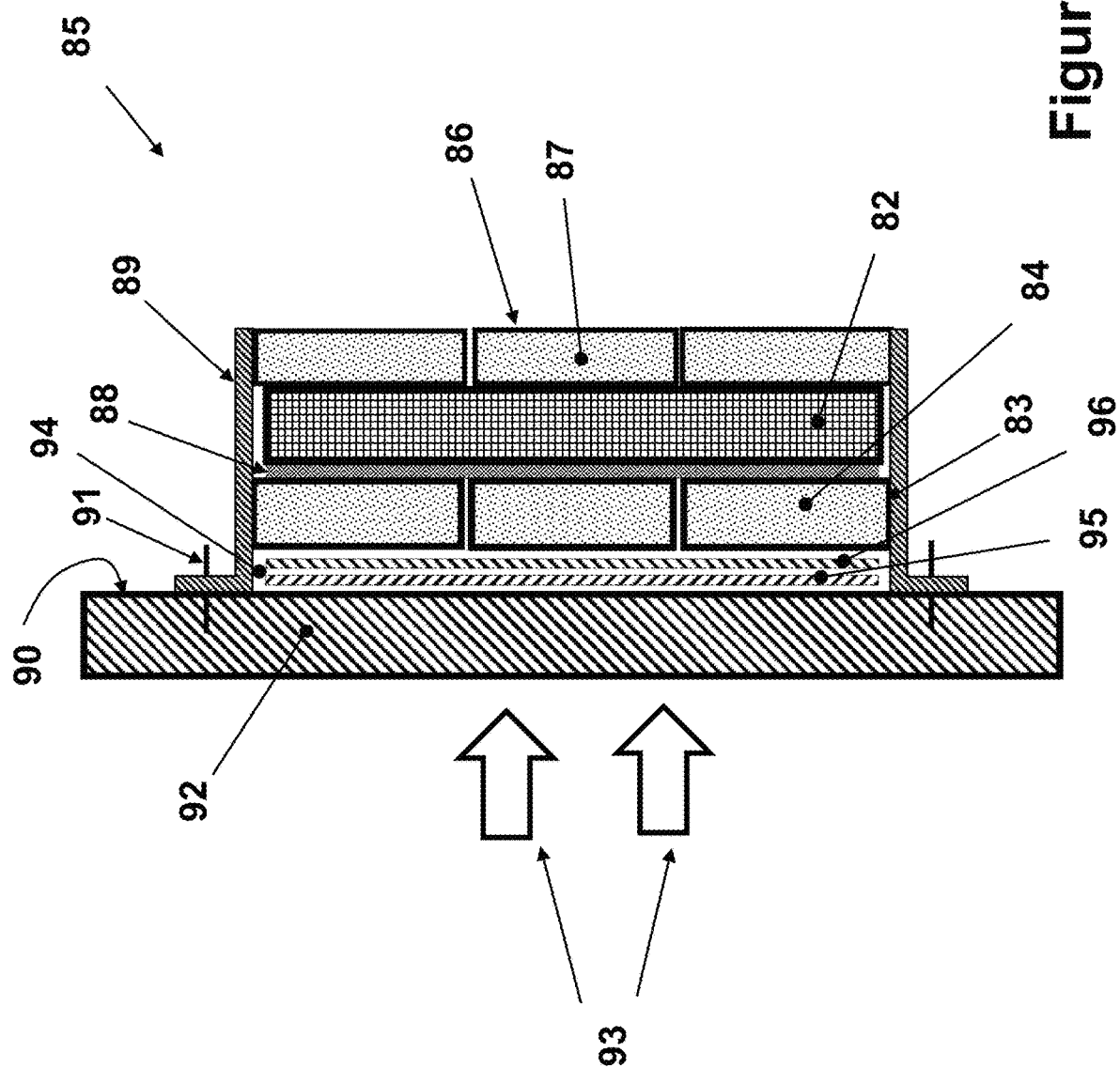
FIG. 21 illustrates another TEGS embodiment with passive and active temperature control of the input heat energy to the TEG modules.

The TEGS embodiment 85 of FIG. 21 is constructed using the basic TEG module and phase changing material filled containers of the TEGS embodiment 40 of FIG. 13. The TEGS embodiment 85 of FIG. 21 consists of an assembly of TEG modules 82, on the high temperature side of which are provided at least one sealed container 83 that is filled with a phase change material 84 that is designed to melt at a prescribed high temperature limit that the TEG can tolerate (e.g., a zinc and copper alloy for 800° C. that TEG modules based on calcium Magnesium Oxides can tolerate). On the cold side of the TEG modules 82, sealed containers 86 are provided that are filled with phase changing materials 87, which is selected to have a lower melting temperature (for example, tin which melts at 230° C.) than the material 84. A relatively thin plate 88 with high thermal conductivity, such as copper, may be provided between the containers 84 and the TEG modules 82 to improve temperature uniformity over the TEG module surface. A similar thin plate (nor shown) may also be provided for the same purpose between the containers 86 and the TEG modules 82. The above components of the TEGS embodiment 85 are assembled within the side structure 89. The structure 89 of the TEGS embodiment 85 is in turn fixedly attached to the side 90 of the plate 92 by fasteners 52 or other methods known in the art. The plate 92 is subjected to the high temperature heat flux as shown by the arrows 93.

Figure 22:
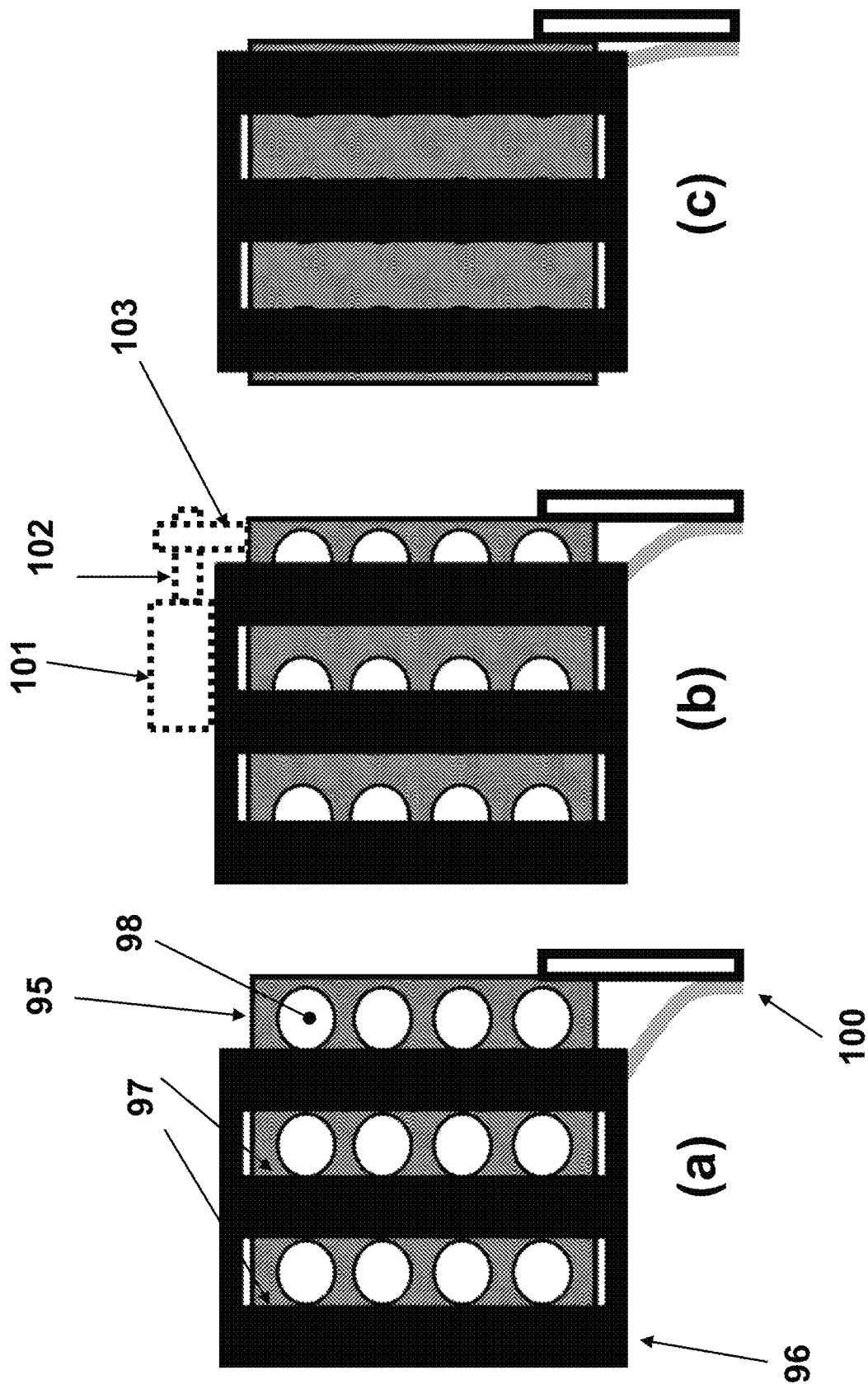
FIG. 22 illustrates the temperature control masking mechanism of the TEGS embodiment of FIG. 21.

As can be seen in the schematic of FIG. 21, a gap 94 is provided between the containers 83 and the surface 90 of the plate 92. At least two overlaying plates 95 and 96, FIGS. 21 and 22, with relatively high thermal insulating characteristics are positioned within the gap 94, with at least one being capable of translating in and out as viewed in the schematic of FIG. 21. A typical overlaying pair of plates 95 and 96 are shown in FIG. 22. The function of these plates is to control the amount of heat that is transmitted (primarily via radiation) to the containers 83. To this end, the plate 96 is provided openings 97, which in the configuration (a) of FIG. 22 allows for maximum exposure of the containers 83 to radiative heat from the surface 90 of the plate 92 through the openings 98, noting that the plate 95 is considered to be covering the entire surface of the containers 83. Now by displacing the plate 96 over the plate 95 as shown in the configuration (b) and then (c) of FIG. 22, the said exposure is reduced by half and totally, respectively. Therefore, by controlling the position of the plate 96 over the plate 95, the amount of heat that is transferred to the containers 83 and thereby the phase changing materials 84 is controlled.

In the schematics of FIG. 22, the plate 96 is shown to be provided with rectangular openings 97 and the plate 95 with circular openings 98. It is, however, appreciated by those skilled in the art that the plates 95 and 95 may be provided with openings with various other geometries as long as once they are overlapped and one is displaced relative to the other, such as shown in the configurations (a), (b) and (c) of FIG. 22, the resulting pass-through opening is closed at one positioned and continuously opens with the said relative displacement of the plates.

The relative displacements of the plates 95 and 96 may be provided by either passive or active actuation mechanisms. Passive actuation may be provided with a bi-metal (or shape memory or the like) actuation mechanism 100 as shown in FIG. 22. The bi-metal actuator 100 is then designed to continuously displace the plate 96 relative to the plate 95, from the configuration (a) towards the configuration (c), as the temperature of the containers 83, FIG. 23, begins to exceed the prescribed temperature with the goal of keeping the phase changing materials 84 of the containers at its melting point temperature. The relative motion may also be provided actively using an electric motor or solenoid type actuator 101, which is attached to one of the plates (96 in FIG. 22). The sliding member 102 of the solenoid is then attached to the other plate (95 in FIG. 22) by the attachment member 103, which is fixedly attached to the plate 95.

It is appreciated that when using an active actuation mechanism, a temperature sensor must also be provided in the gap 94 or on the containers 83 (not shown) to provide the sensory input for the actuation of the electric motor/solenoid 101 control. It is also appreciated that both passive and active actuators may be used to provide a two-position switching action that either opens or closes the flow of heat to the containers 83, i.e., positions the plate 96 in either (a) or (c) configurations, FIG. 22.

The operation of the modified TEGS embodiment 85 of FIG. 21 is similar to that of the TEGS embodiment 40 of FIG. 14, except that in the latter TEGS embodiment transfer of heat to the containers 42 of phase changing materials 43 is controlled by varying the depth of the gap between the containers 42 and the surface 50 of the plate 48 and in the former TEGS embodiment by controlling the extent of the opening through which heat is conducted to the containers 83 with the phase changing material 84 on the hot side of the TEG modules of the device.

Prior to TEGS exposure to high temperature heat flux 93, the sealed containers 83 filled with the solid phase-change material 84 are positioned as shown in FIG. 21 a certain distance from the surface 90 of the plate 92. At this point, the plates 95 and 06 are positioned as shown in the configuration (a) in FIG. 22, thereby allowing maximum amount of heat to flow to the containers 83 through the openings 98. Once the TEGS is exposed to the high temperature heat flux 93, as the temperature of the plate 92 rises, heat is transmitted to the containers 83 and to its filled solid phase-change material 84, primarily through radiation, and through conduction to the TEG modules 82 (via the intermediate plate 88 if provided).

The phase-change material 84 is also designed to melt at a prescribed high temperature that the TEG can tolerate (e.g., a zinc and copper alloy for 800° C. that TEG modules based on calcium Magnesium Oxides can tolerate). Then as the temperature of the surfaces of the containers 83 that face the plate 92 rises above the high temperature limit of the TEG modules, the phase-change material 84 would absorb the heat and when its temperature reaches its melting point, it begin to melt, absorbing heat at its constant melting temperature.

Once the phase-change materials 84 in the filled containers 83 are melted, the temperature of the passive bi-metal (shape memory or the like) actuators 51 continue to rise. Once the temperature of the passive bi-metal actuator 100 has reached a preset threshold, the actuator is designed to begin to displace the plate 96 (here, the plate 95 is considered to be fixed relative to the containers 83) relative to the plate 95, thereby reducing the size of the opening through which heat flows to the containers 83, i.e., from their configuration (a) of FIG. 22 towards their configuration (c). When an active actuation device (motor 101 with components 102 and 103, FIG. 22) is provided, the displacement is controlled by a temperature sensory input as was previously described. Thus, lowing the rate at which heat energy is transmitted from the containers 83 and thereby the phase change material 84.

As a result, by proper design of the described "high-temperature protection mechanism" of the TEGS, the temperature of the hot side of the TEG modules of the TEGS can be kept close to the predetermined optimal temperature, usually the maximum allowable temperature for the TEG type being used, during nearly the entire duration of the operational cycle of the TEGS.

As can be seen in the schematic of the FIG. 21, on the cold side of the thermoelectric generator modules, containers 86, filled with (phase changing) materials 87, are also provided and are designed to function as was previously described for the embodiment of FIG. 7. Thus, by the proper design of the aforementioned active or passive actuators and sizing of the volumes of the phase-change material 84 and 87, FIG. 21, the thermoelectric generator modules 82 are subjected to a nearly constant and predetermined temperature gradient during a significant, if not most, of the operating cycle of the TEGS. As a result, a highly efficient, predictable and reliable power source is provided that is not sensitive to the unavoidable input temperature and heat flux 93 variations.

It is also appreciated that once the input temperature and heat flux 93, FIG. 21, has dropped below the optimal hot side temperature of the TEG modules 82, the temperature of the molten phase-change material 84 stays constant due to the latent heat of melting of the material for a considerable amount of time. As a result, while the molten phase-change material 84 on the hot side of the TEG modules 82 is cooling and solidifying, the temperature gradient across the TEG modules stays at its optimal level and the TEG modules 82 would generate their designed level of electrical energy.

In the TEGS embodiment 85 of FIG. 21, the phase changing materials 84 on the hot side of the TEG modules 82 are stored in more than one container 83. However, it is appreciated that a single container 83 may also be used. The advantages of using smaller containers 83 include the ease of manufacture and the use of lighter container material to prevent excessive deformation during the heating and cooling cycles and prevention of uneven melting patterns. The phase changing materials 87 on the cold side of the TEG modules 82 may also be stored in fewer containers 86, even a single container, while temperature variation effects being less pronounced on these containers due to their lower temperature levels.

In applications such as in supersonic projectiles, the projectile is initially subjected to high levels of accelerations and high temperature aerodynamic heating of its leading edges. In such applications, the high temperature heat flux is usually very high and only a small portion of it can be harvested for conversion to electrical energy. The projectile is also subjected to launch conditions only once and the duration of the fight is generally very short and at most a few minutes. In such applications, the novel method described below may be used to adapt most TEGS embodiments of the present invention to optimally harvest the input heat energy and convert it to electrical energy with a significantly simpler mechanism that do not require any passive or active actuation mechanism. Here, this novel method is described by its application to the TEGS embodiment 60 of FIG. 15 as shown in the schematic of the TEGS embodiment 105 of FIG. 23.

Figure 23:
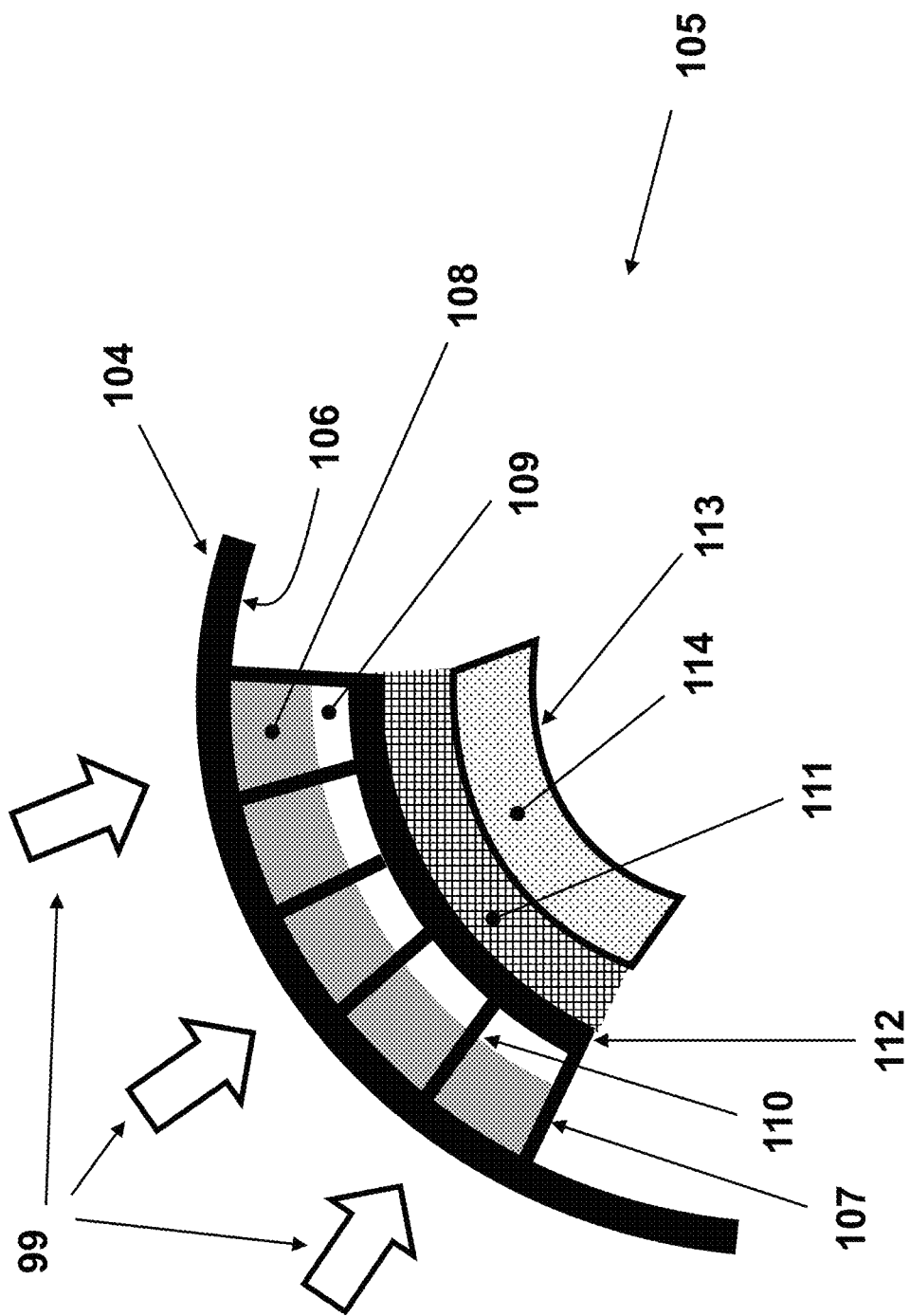
FIG. 23 illustrates another TEGS embodiment configured for one cycle of high temperature heat energy harvesting and conversion to electrical energy.

FIG. 23 illustrates the TEGS embodiment 105 that is designed mostly for one cycle of high temperature heat energy harvesting and efficient conversion to electrical energy. In the schematic of FIG. 23, the TEGS embodiment 105 is shown in its state before being subjected to the high temperature heat flux for heat energy harvesting. Similar to the TEGS embodiment of FIG. 15, the TEGS embodiment 105 is constructed with sealed containers 107 (5 sealed containers are shown in FIG. 23), which are partially filled with phase changing material 108 that is designed to melt (phase change) at a desired temperature. The sealed containers 107 are in contact with the inside surface 106 of the outer housing 104 of the object that is subjected to the aforementioned high temperature heat flux cycle, such as leading edges of a supersonic projectile. The sealed containers 107 may be integral to the housing 104 as shown in FIG. 23 or may have separate complete sealed housings that are attached to or are kept in contact by external means (not shown) with the inner surface 106 of the housing 104. The containers 107 may also share side walls 110.

In the preheating state of FIG. 23, as can be seen the phase change material 108 is used to fill the side of the sealed containers 107 that is in contact with the inner surface 106 of the housing 104. As a result, the aft portion 109 of the container 107 volume is thereby is unoccupied.

The casing of the containers 107 is selected to ensure that it could withstand the high temperatures of the heat influx 99. For example, the casing of the containers 107 may be made out of stainless steel and the filling phase-changing material be made out of an aluminum alloy with a melting temperature of 500° C. or zinc or tin, with melting temperatures of 420° C. and 230° C., respectively.

The TEG modules 111 are then attached to the bottom surface 112 of the containers 107. It is appreciate that in the state of the TEGS 105 shown in FIG. 23, the mode of heat transfer from to the bottom surface 110 from the input heat flow 99 is by radiation from the material 108 by radiation and through the side walls 110 by conduction. On the cold side of the TEG modules 111, containers 113 are provided, which are filled with (phase changing) materials 114 with lower melting temperature than those of the material 107.

In the TEGS embodiment 105 of the present invention, the difference between the melting temperatures of the materials 108 and 114 of the sealed containers 107 and 113, respectively, is to provide the desired temperature gradient across the TEG modules 111 as described later in this disclosure.

It is appreciated that in the TEGS embodiment 60 of FIGS. 15-16, the function of the phase change material 55 filled sealed containers 54 and the passive actuation devices 62 (bimetal or shape memory or the like) is to protect the TEG modules 63 of the TEGS from temperatures higher than what they can tolerate. Such assemblies constituted the aforementioned "high-temperature protection mechanisms" for the TEG modules 63. In the TEGS embodiment 105 of FIG. 23, this function is performed without requiring a passive or active actuation mechanism as follows. As heat due to the high temperature heat flux 99 begins to be transmitted through the housing 104 into the containers 107, to the phase changing material 108 begins to be heated. Then as the material 108 is heated, heat energy is transmitted through radiation and through conduction via the side walls 110 to the bottom surface 112 of the containers 107 and thereby to the TEG modules 111. The temperature difference between the hot side and the cooler containers 113 on the cool side of the TEG modules will then begin to generate electrical energy.

Figure 24:
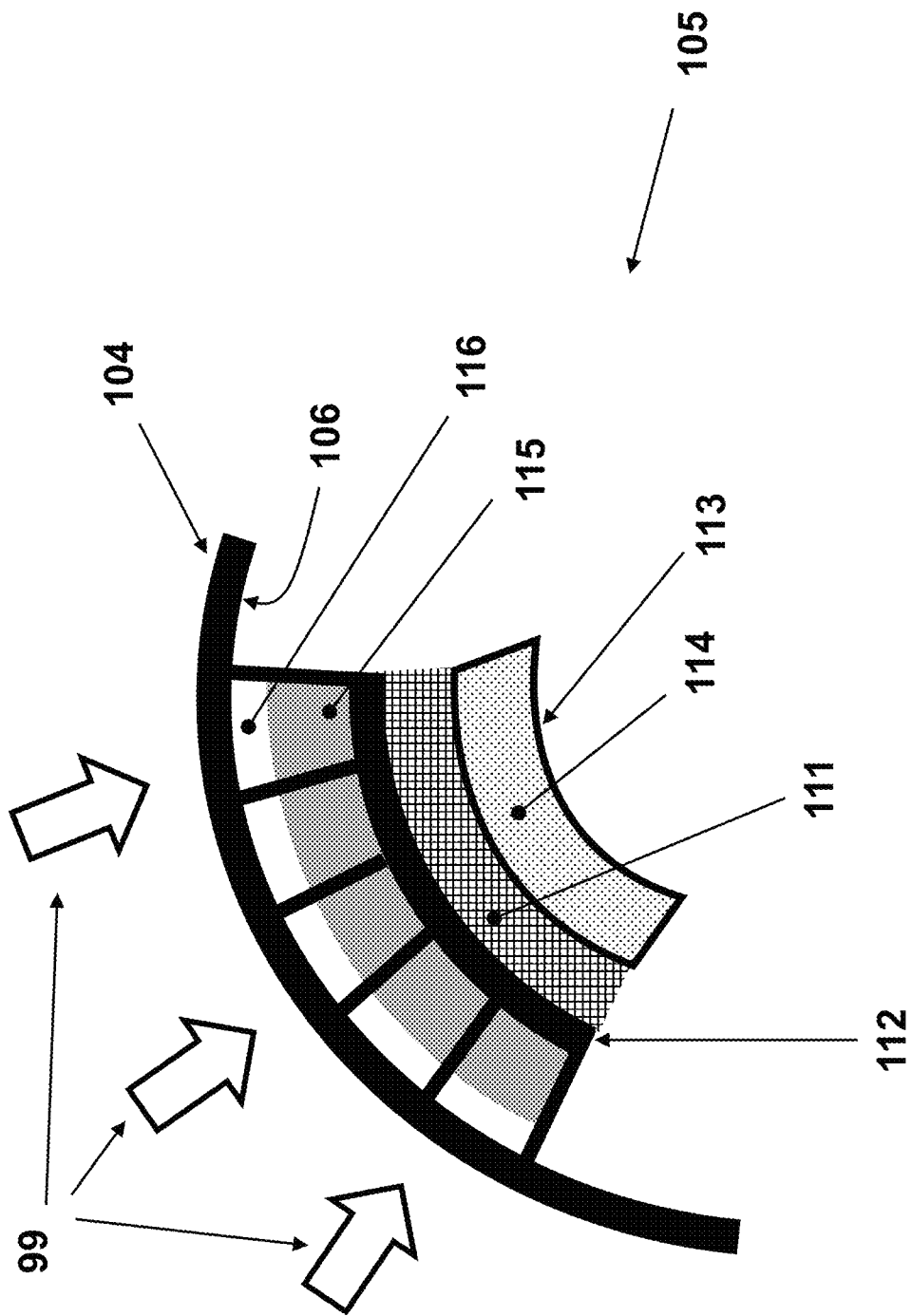
FIG. 24 illustrates the configuration of the TEGS embodiment of FIG. 23 following melting of the phase changing material on the hot side of the TEG modules.

Then as high temperature heat flux 99 heats the phase change material 108, at some point the material temperature reaches its melting point and begins to melt. At this point, either due to the gravity (when the TEGS is directed upwards relative to the ground) or due upward acceleration of the object as viewed in the schematic of FIG. 23 (e.g., a supersonic projectile that has been launched), the melting material 108 drop (flow) down to the base 112 of the containers 107 as shown in FIG. 24, and begin to directly conduct heat to the TEG modules through the base 112 of the containers 107. From this time on, heat flow from the housing 104 continue to be transmitted to the material 108 via radiation from the surface 106 and through the side walls 110 to the material 108 as well as the base 112 of the containers 112, but at a lower rate.

It is appreciated that the heat flux entering the hot side of the TEG modules is partially converted to electrical energy by the TEG modules as was previously stated and the remainder is passed through, in the case of the TEGS of FIG. 23, to the containers 113 and thereby to the filling phase changing materials 114 (for example, tin at 230° C.), which is selected to have a lower melting temperature than the material 108. Then as the materials 114 begins to melt, it keeps on absorbing heat at its constant melting temperature. As a result, while the phase changing materials 108 and 114 are in molten phase, their temperatures are constant and thereby a constant temperature gradient is applied across the TEG modules 111 of the TEGS.

It is appreciated that when the TEGS embodiment 105 of FIG. 23 is being accelerated upwards or is subjected to gravity acting in the downward direction as viewed in the schematic of FIG. 23, then the melting phase change material 108 would flow down to the bottom of the containers 107 (indicated by numeral 115 in FIG. 24), leaving a gap 116 between the phase change material 116 and the inner surface 106 of the housing 104 (or top surface of the containers 107—if provided). From this point on, heat flow to the phase change material 115 is by radiation from the surface 106 and conduction via the side walls 110.

Therefore, by the proper selection and sizing of the amount of the phase-change materials 108 and 114, FIG. 23, the TEG modules 111 are subjected to a nearly constant and predetermined temperature gradient during a significant, if not most, of the required operating cycle of the device, for example a supersonic projectile, that is being partially of fully powered. As a result, a highly predictable and reliable power source is provided that is not sensitive to the unavoidable input temperature and heat flux 99 variations.

It is also appreciated that once the input temperature and heat flux 99, FIG. 23, has dropped below the optimal hot side temperature of the TEG modules 111, the temperature of the molten phase-change material 108 stays constant due to the latent heat of melting of the material for a considerable amount of time. As a result, while the molten phase-change material 108 (115 in FIG. 24 state) on the hot side of the TEG modules 111 is cooling and solidifying, the temperature gradient across the TEG modules 111 stays at its optimal level and the TEG modules would generate their designed level of electrical energy.

It is appreciated by those skilled in the art that many supersonic munitions are launched at high Mach speeds and their speed drop later during the flight. In such applications, the TEGS embodiment 105 of FIG. 23 has the advantage of using the heat energy stored in its phase changing material 108 (115 in FIG. 24 state) on the hot side of the TEG modules 111 to keep on providing electrical energy its peak levels and serve as a reliable and predictable source of power for a significant amount of time until the phase changing material 108 has solidified, which by proper selection of the phase changing material and its volume could cover the entire flight time of the supersonic projectile.

The TEGS embodiment 105 of FIG. 23 is also particularly suitable for addressing unique characteristics of the high Mach speed projectiles as described previously since it enables optimal harvesting of the input heat energy from leading surfaces of the projectile and its conversion to electrical energy in a predictable and reliable process, while providing thermal protection for interior heat sensitive components of the projectile.

It is also appreciated by those skilled in the art that like the TEGS embodiment 60 of FIG. 15, the TEGS embodiment 105 of FIG. 23 can also adapted for use on curved surfaces, such as the nose area of a supersonic projectile or the cylindrical outer surfaces of a hot tube, or any other similar curved surfaces.

It is also appreciated by those skilled in the art that if the TEGS embodiment 105 of FIG. 23 is not being accelerated upward or subjected to gravity as described above, the phase changing material 108 would still at least partially separate from the surface 106 of the containers 107, thereby reducing the amount of heat energy that is being transmitted to the TEG modules 111 via the base 112 of the containers 107.

It is also appreciated by those skilled in the art that the TEGS embodiment 60 of FIG. 15 and the TEGS embodiment 105 of FIG. 23 may also be constructed as multi-stage TEGSs as was previously described for the TEGS embodiment of FIG. 19.

The advantage of using multi-stage TEGSs is that a higher percentage of the input heat energy to the system can be converted to electrical energy. However, it is appreciated that with the current TEG module technologies, the maximum amount of the heat energy that can be harvested and converted to electrical energy is 5-10 percent and even with a two-stage TEG module, it might be able to be increased to 10-15 percent while the temperature levels at the hot and cold sides of the TEG modules are maintained at their proper gradient levels.

It is appreciated by those skilled in the art that in a two-stage TEGS, such as in the embodiment of FIG. 19, the TEGS operates at its peak performance level in terms of generating the electrical energy when all phase changing materials (24, 21 and 81) are at their melting point temperatures. It is also appreciated that the temperature drop from the hot side and the cold side of the TEG modules of each stage is desired to be high so that the TEG modules can harvest maximum amount of heat and convert it t electrical energy. As a result, the temperature of the cold side phase change material of the first stage (21 in FIG. 19), which is the temperature of the hot side of the second stage TEG modules, is low enough to provide the desired temperature gradient across the TEG modules 19 of the first stage. As a result, the temperature gradient of the second stage TEG modules 79 cannot be high. As a result, the addition of a third stage TEG modules would not significantly improve the TEGS effectiveness.

It is also appreciated by those skilled in the art that for applications in which high temperature heat flux is essentially continuous, i.e., runs not in terms of minutes but hours or days, then the phase change materials on the hot side and the cold side will eventually melt completely and their temperatures begin to rise above the levels that can be tolerated by the TEG modules of the system. Therefore, appropriate means, such the heat the overlaying plates 95 and 96 that are made of heat insulating materials, or appropriate cooling mechanisms must be provided to control heat energy input to the phase changing material on the hot side of the TEG modules and appropriate means, such as cooling fins or the like must be provided to dissipate the input heat from the phase changing material on the cold side of the TEG modules. The required heat dissipation from the cold side phase change material containers cannot in general require electrical energy, such as by the used of fans or circulating fluid, since the TEGS generated electrical energy is generally low and most of the generated electrical energy has to be spent on controlling the temperature of the cold side of the TEG modules.

As a result, when a continuous high temperature and high flux heat source is available for harvesting and conversion to electrical energy, the above disclosed embodiments and other currently available methods can only allow a small portion of the available heat energy to be transmitted to the TEG modules of the harvesting device and out of the transmitted portion, only a small portion can be effectively be converted to electrical energy since the temperature gradient across the TEG modules cannot be maintained continuously since only a small portion is absorbed (converted to electrical energy) by the TEG modules and the remainder is passed through to the environment or to phase changing material, when provided.

The novel methods that are described below are shown to be suitable for the design of TEGSs that can effectively harvest heat from continuously provided high temperature heat flux sources and convert it to electrical energy. Examples of the basic the TEGS designed using the present novel methods are also provided and described in detail.

Figure 25:
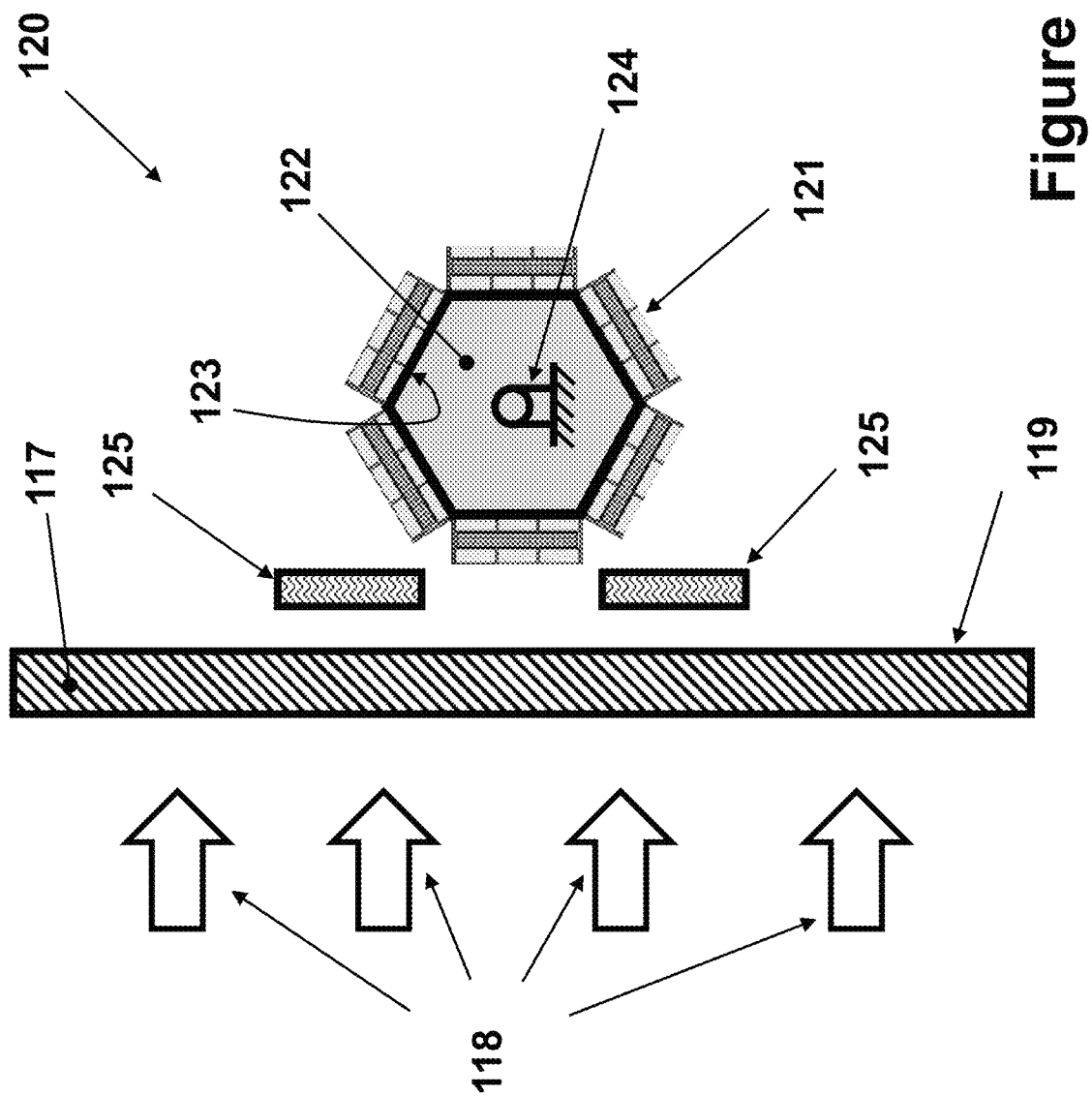
FIG. 25 illustrates the method of designing TEGSs for continuous harvesting a significant portion of high temperature heat flux and converting it to electrical energy.

The first novel method for harvesting a significant portion of available heat energy from a high temperature and high heat flux source is based on providing an appropriate number of heat "energy storage members" that are sequentially "filled" with heat energy and are then allowed to transmit heat at much slower rate to provided TEG modules at (generally much lower) temperatures that the TEG modules can tolerate. By providing a large enough number of such heat energy storage members that are couples with appropriate TEG modules, most of the continuously available high temperature and high flux heat energy can be made available for conversion to electrical energy. In the schematic of FIG. 25 an example of a TEGS that is designed based on this method is provided.

In the schematic of FIG. 25, the plate 117 is considered to be the wall of a system (for example a furnace) through which the high temperature heat flux shown by the arrows is made continuously (or time to time for considerable lengths of time) available for harvesting and conversion to electrical energy. The high temperature heat is then transmitted to the "heat energy storage and TEG module assembly" units 121 (FIG. 26) of the TEGS (indicated as embodiment 120 in FIG. 25), primarily by radiation. It is appreciated that depending on the heat source, a plate 117 may not be present and in that case the units 121 are subjected directly to the high temperature heat flux as shown by the arrow 118.

Figure 26:
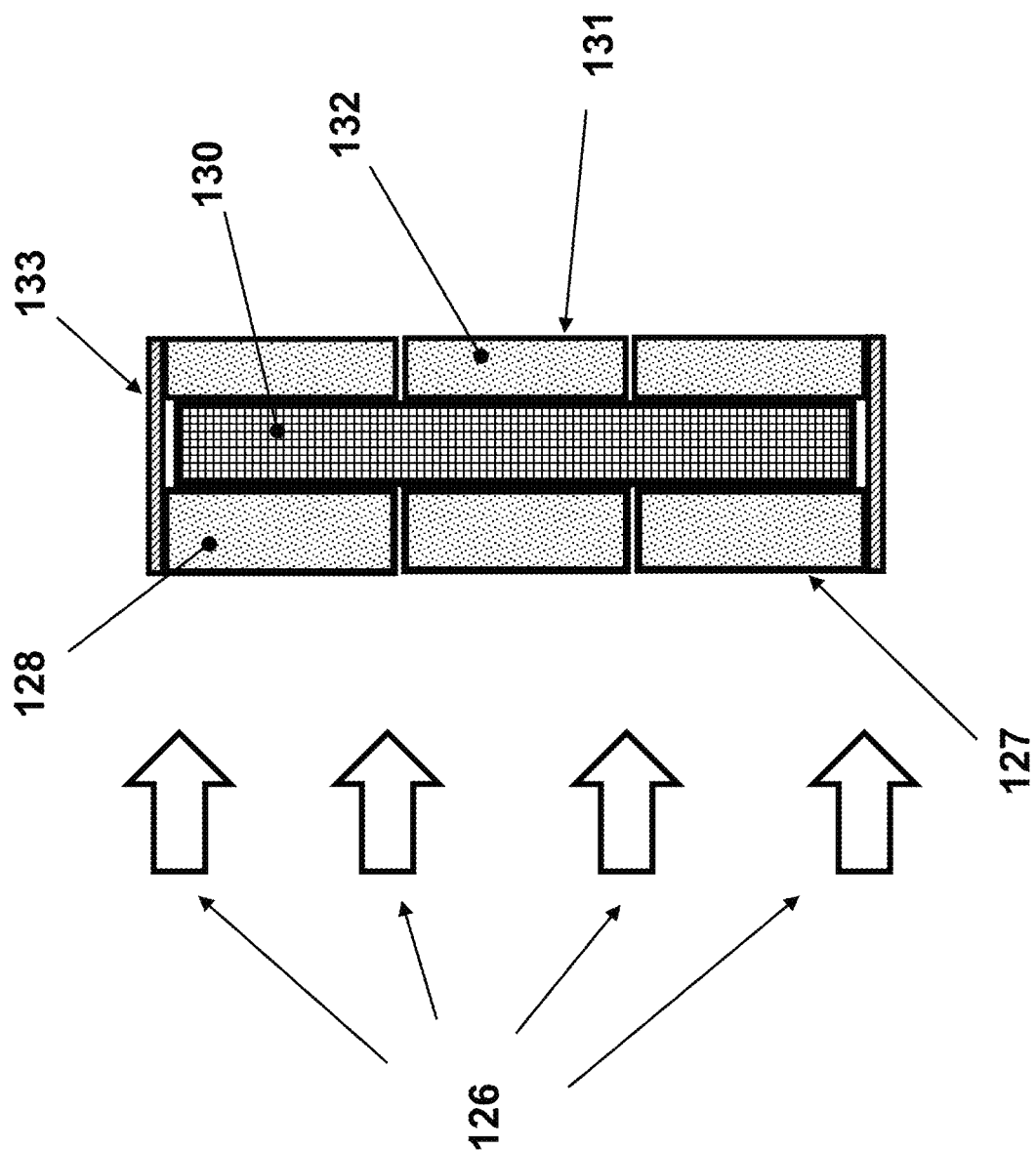
FIG. 26 illustrates a heat storage and TEG module unit of the TEGS embodiment of FIG. 25.

The TEGS embodiment 120 consists of a rotating member 122 that is fixed to the ground (a structure that is fixed relative to the plate 117) by the rotary joint 123. The rotating member 122 is provided with a shell structure 123, which may be circular or hexagonal as shown in FIG. 25 or other preferably equal side polygons. At least two "heat energy storage and TEG module assembly" units 121 shown in the schematic of FIG. 26 are then attached to the sides of the shell structure 123 of the rotating member 122 as shown in FIG. 25. It is appreciated that more than one "heat energy storage and TEG module assembly" units 121 may be provided along the length of the rotating member 122 shell structure 123.

As can be seen in the schematic of FIG. 26, a "heat energy storage and TEG module assembly" unit 121 consists of TEG modules 130, on the hot side of which is provided with containers 127 that are filled (partially or fully) with phase changing material 123. The containers 127 are intended to face the input high temperature heat flux 126. On the cold side of the TEG modules, containers 131 that are filled (partially or fully) with phase changing material 132 may also be provided. Alternatively, well known heat sink elements, such as fins may be provided on the cold side of the TEG modules. The "heat energy storage and TEG module assembly" unit 121 may also be multi-stage as described for the TEGS embodiment of FIG. 20 rather than being single stage as shown in FIG. 25.

The TEGS embodiment 120 then operates as follows. At each point in time, one of the "heat energy storage and TEG module assembly" units 121 is positioned facing the surface 119 of the plate 117 as shown in FIG. 25. In this configuration, the unit 121 facing the surface 119 is subjected to maximum high temperature heat input. In certain conditions, such as when radiation level is very high, heat resistant protective plates or the like members 125 may be provided as shown in FIG. 25 to block heat from being transmitted to units 121 that are not facing the surface 119 of the plate 117. Then once the phase change material 128 in the container 127 that is directly facing the incoming high temperature heat flux has melted or is close to be completely melted, the rotating member 122 is rotated to make the next "heat energy storage and TEG module assembly" unit 121 to directly face the incoming high temperature heat flux. It is appreciated that the next unit 121 may be an adjacent or any other one of the provided units 121 on the rotating member 122. The rotation of the rotating member 122 may be by active actuation mechanisms or by passive actuation mechanism as described later in this disclosure.

It is appreciated by those skilled in the art that by sequentially "collecting" and storing incoming high temperature heat flux 118 in the phase changing material 128 of the "heat energy storage and TEG module assembly" unit 121 and allowing the stored heat to be transmitted to the TEG modules 130 at constant melting point temperature of the phase changing material 128 until the material is almost entirely solidified, and repeating the cycle of heating again, a very large portion of the available heat energy can be harvested for electrical energy generation. The TSGS is made more effective as previously described by the provision of phase changing materials 132 on the cold side of the TEG modules of the "heat energy storage and TEG module assembly" unit 121, FIG. 26, or by providing heat sinks to absorb and keep the temperature low on the cold side of the TEG modules of the units 121. It is also appreciated that even higher percentage of the provided heat energy is converted to electrical energy as previously described by using multi-stage "heat energy storage and TEG module assembly" units instead of single stage units 121 of FIG. 26.

It is appreciated by those skilled in the art that mechanisms other that the rotating member 122 of FIG. 25 may be used to sequentially position single or multi-stage "heat energy storage and TEG module assembly" units to face the incoming high temperature heat flux to store a significant amount of heat energy in the unit phase changing material and for subsequent conversion to electrical energy by the unit TEG modules. For example, the "heat energy storage and TEG module assembly" units may be mounted on continuous conveyer type chain drive and be sequentially positioned facing the heat source as was described for the embodiment of FIG. 15. In addition, the "heat energy storage and TEG module assembly" units may be designed to form essentially a continuous belt by the use of smaller units that are "linked" together similar to a chain.

Figure 27:
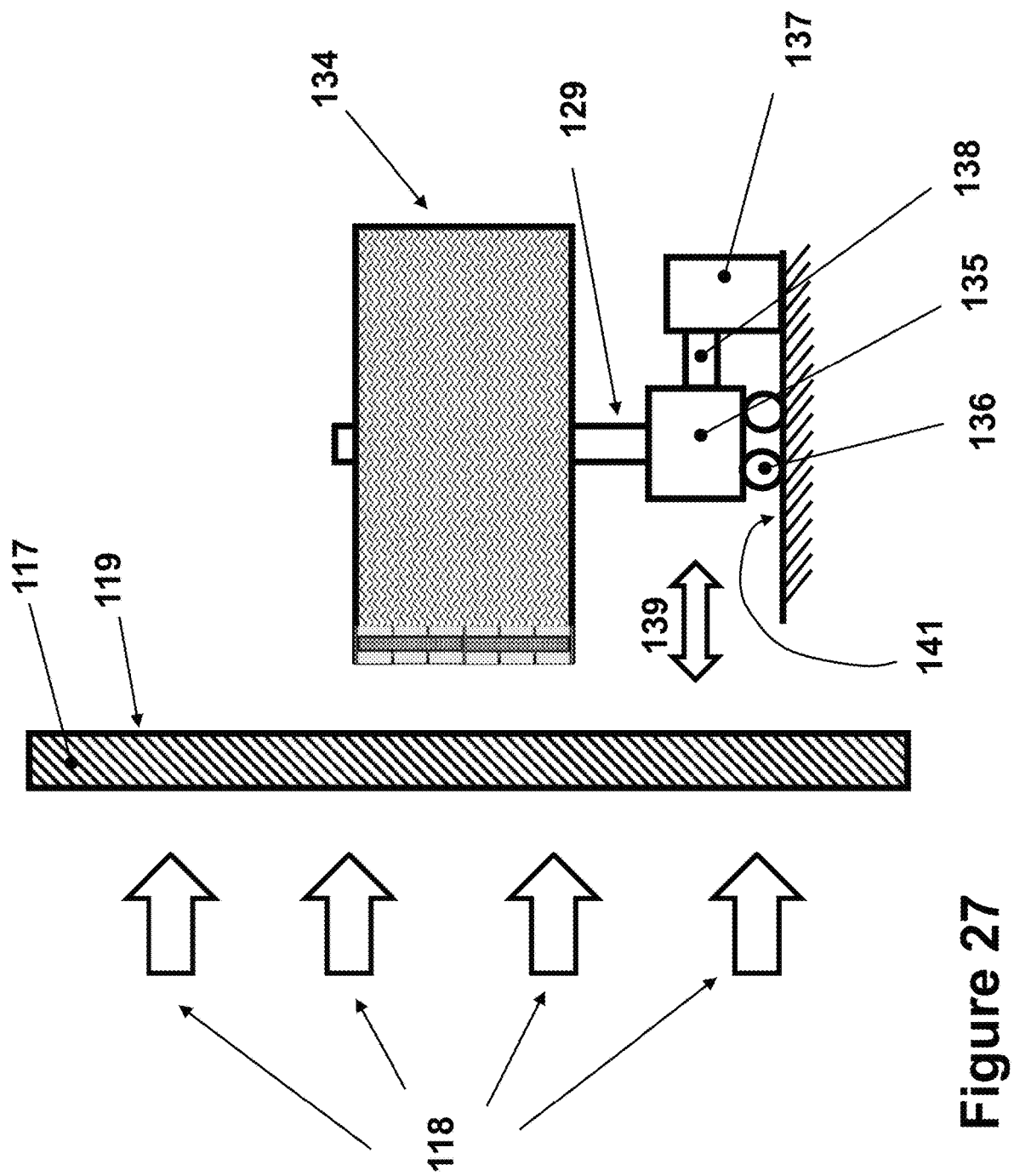
FIG. 27 illustrates a method of actuating the TEGS embodiment of FIG. 25 and a method of varying heat transfer rate to the heat storage and TEG module unit of the TEGS.

A method of actively actuating the rotating member 122 of the TEGS embodiment 120 of FIG. 25 is shown in the schematic of FIG. 27. In this method, the rotating shaft 129 of the assembly of the rotating member 122 and the "heat energy storage and TEG module assembly" units 121, collectively identified by the numeral 134 in FIG. 27, is connected to a rotary electric motor 135. The electric motor 135 is provided with a controller (not shown) and preferably a temperature sensor that measures the temperature of the phase changing material container facing the surface 119 through which high temperature heat flux flows as shown by the arrows 118. When the system is provided with a temperature sensor (not shown), then as the temperature of the surface of the container 127, FIG. 26, facing the TEG modules begin to move above the melting point of the phase change material 128, the motor is commanded to rotate to bring the next "heat energy storage and TEG module assembly" unit 121 to face the incoming heat, i.e., the surface 119 of the plate 117. In the absence of a temperature sensor, the controller is programmed to perform the sequential rotations after a certain programmed elapsed time that is determined by the user that is the amount of time within which the phase changing material 128 is nearly or completely melted.

It is appreciated by those skilled in the art that as it is previously described, the rotary motor 135 is provided for positioning the "heat energy storage and TEG module assembly" units 121 to sequentially face the incoming heat flux 118 though the plate 177 as shown in FIG. 25. As can be seen and described above, the "heat energy storage and TEG module assembly" units 121 are positioned a certain distance from the surface 119 of the plate 117 as shown in FIG. 25, thereby heat energy is transmitted to the facing phase change material 128 filled containers 127 primarily by radiation.

However, if higher rate of heat transfer to the phase change materials 128 is desired, then the phase change material 128 filled containers 127 can be brought into contact with the surface 119 to transfer heat to the containers 127 via conduction. To this end, as can be seen in the schematic of FIG. 27, the motor 135 assembly is mounted on a sliding rail 136 that can translate in the guide 141 (shown as ground) back and forth from the plate 117. The said assembly is then actuated back and forth as shown by the arrow 139 by the linearly actuating electric motor 137 via the connecting member 138. The electric motor 137 can then be used to bring the phase changing material 128 filled containers 127 in contact with the face 119 of the plate 117 to maximize the rate of heat transfer to the phase changing materials 128 via conduction, or provide the required gap with the surface 199 to lower the rate of heat transfer (via radiation) to the desired level and to allow for the rotation of the assembly 137 for sequential heat transfer to the "heat energy storage and TEG module assembly" units of the TEGS.

The disclosed TEGS embodiments, for example those of FIG. 7, 9, 11, 13, 19 or 25, may be used to construct a powering system for residential or commercial use that would keep heating and/or hot water system operating under power outage conditions. The schematic of such a "heating and hot water system powering" embodiment of the present invention is shown in FIG. 28.

Figure 28:
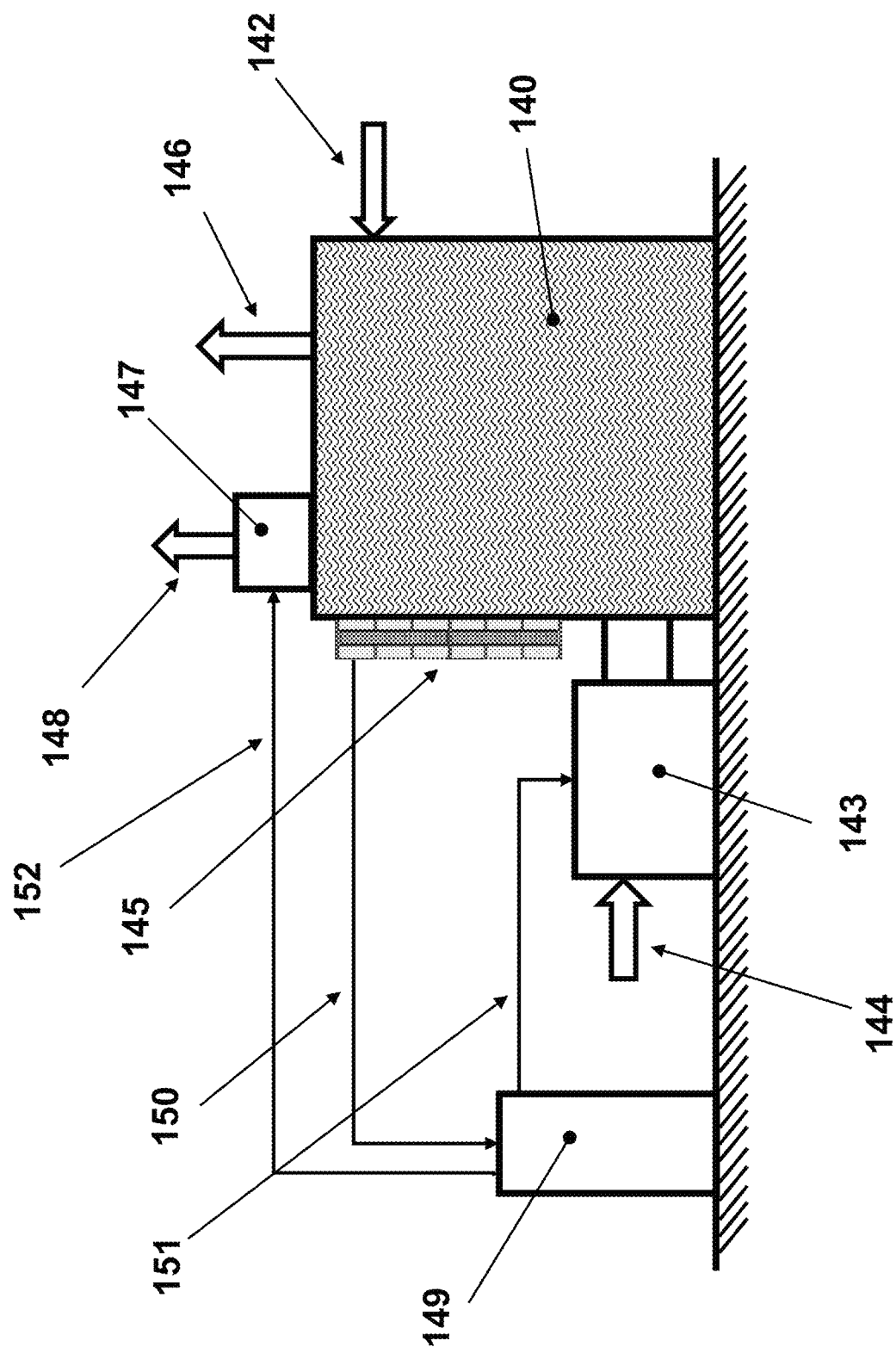
FIG. 28 illustrates a TEGS for home heating and hot water system powering under power outage conditions.

In the schematic of FIG. 28 a water heating system is shown that consists of a blower 143 with input fuel (gas or oil) 144 that burn the fuel in a burner to heat water using a heat exchanger inside a simplified block 140, within which hot water storage tanks may also be provided to store hot water for washing and other uses. The hot water (or steam) may also be circulated by the circulating pump 147, the output of which 148 is used for home heating through a piping system (not shown). The arrow 142 is intended to indicate the input water line. It is appreciated that the above schematic is provided for the purpose of describing the present "heating and hot water system powering" that would keep the system operating during power outage events. It is appreciated that many different residential and commercial heating and hot water providing systems exists and the disclosed "heating and hot water system powering" can be used to power almost all such systems indefinitely during power outage events, as long as the system has available fuel.

Figure 12:
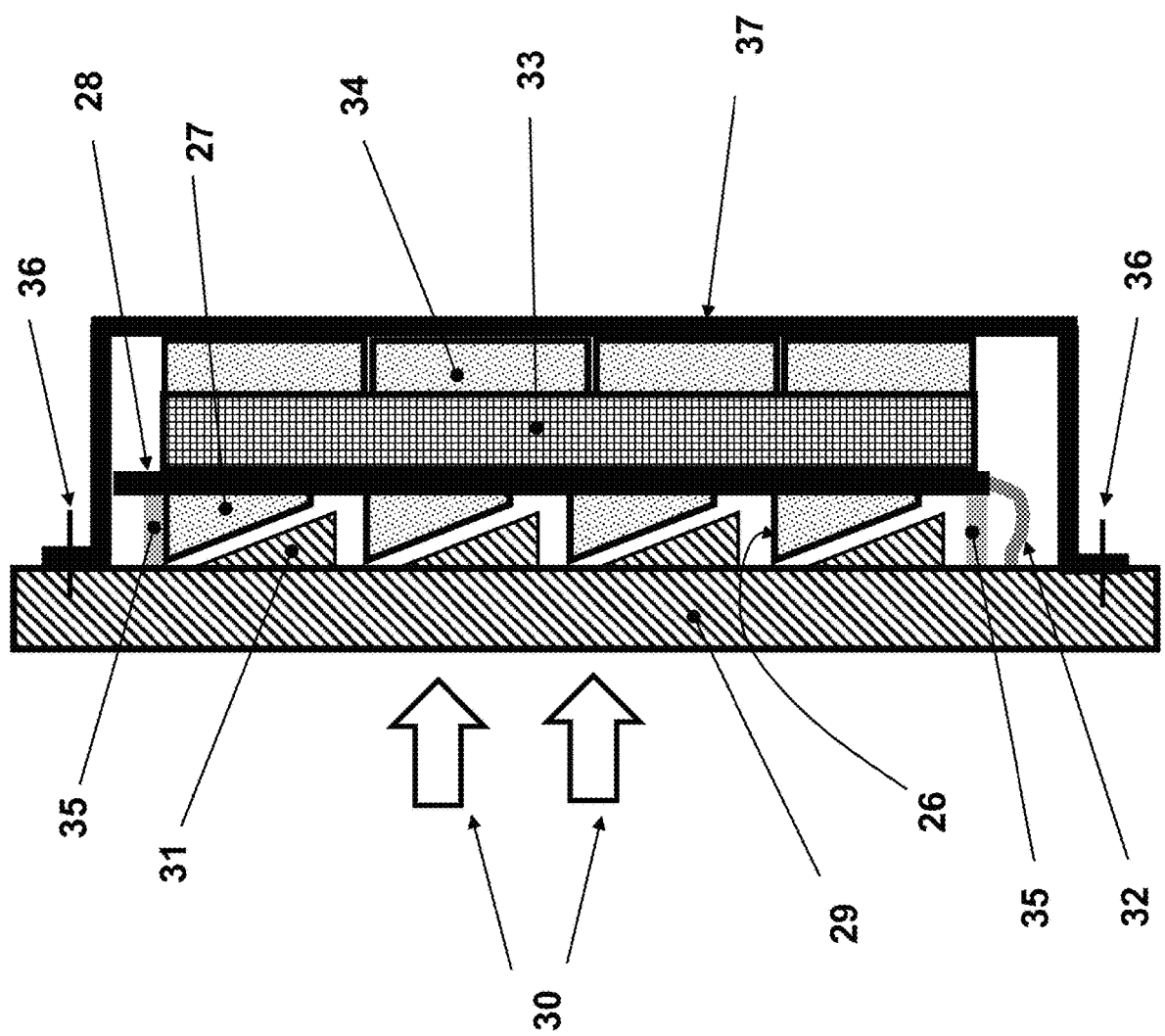
FIG. 12 illustrates the TEGS embodiment of FIG. 11 with components configuration following retraction of the phase change filled containers by the provided passive actuators of the system.

The "heating and hot water system powering" embodiment of FIG. 28 would then provide TEGS units, such as single stage TEGS embodiments of FIG. 9 or 12 or TEG module assembly unit 121 of FIG. 26, or a multi-stage TEGS units such as that of FIG. 19 or 21, as indicated by the numeral 145 in FIG. 28. The TEGS units 145 are attached to the available heated surfaces of the unit burners and/or heat exchangers and/or hot water tanks, so that they could be used to absorb mostly wasted heat energy and convert it to electrical energy. Obviously the TEGS attached to the burner and heat exchangers would absorb heat energy and store in their provided phase changing materials on the hot side of the units TEG modules and convert it to electrical energy even after the burner has been turned off, noting that heating system burners are usually designed to be on only during relatively short periods of times. The TEGS units attached to the hot water storage tanks would almost continuously generate electrical energy. The generated electrical energy is then used to charge an electrical energy storage device 149, such a rechargeable Lithium-ion battery pack and keep it charged.

Then while external power is available, the function of the provided TEGS units 145 is primarily to keep the electrical energy storage device 149 fully charged via the line 150. During this time, excess electrical energy generated by the TEGS may be used to partially power other electrical devices or sent back to the power line. Then in the event of power outage, the electrical energy storage device 149 is used to power the heating system, i.e., to power the blower 143 and burner and the circulating pumps 147 through wirings 151 and 152, respectively, and other electrical and electronic devices of the heating system and its control system. It is appreciated that enough TEGS units must be provided so that they could provide the average power that is consumed by all the electrical and electronic components of the heating system and the TEGS and the electrical energy storage device 149 controls.

It is appreciated by those skilled in the art that since only a relatively small portion of the incoming heat energy can be converted to electrical energy with the currently available TEG modules, even by using multi-stage TEGS and sequential harvesting methods, such as the TEGS embodiment of FIGS. 25-27, therefore the heat energy that is otherwise transmitted to the environment may be used for other purposes.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A thermoelectric generator system comprising:
   a first surface having a first material configured to undergo a phase change at a first temperature;
   an actuator configured to retract the first material from contacting a heat source upon the heat source reaching a predetermined temperature higher than the first temperature; and a thermoelectric generator having a hot side and a cold side, the first material being on the hot side.

2. The thermoelectric generator system of claim 1, wherein the actuator is a passive actuator comprising one of a shape-memory device and a bi-metal device.

3. The thermoelectric generator system of claim 1, further comprising a second material configured to undergo a phase change at a second temperature, the second temperature being lower than the first temperature, the second material being on the cold side of the thermoelectric generator.

4. The thermoelectric generator system of claim 1, wherein the second material is encased on one or more sealed containers.

5. The thermoelectric generator system of claim 1, further comprising a second plate disposed between the first material and the hot side of the thermoelectric generator, wherein the actuator is connected to the second plate to retract the first material towards the second plate.

6. The thermoelectric generator system of claim 1, wherein the thermoelectric generator comprises a plurality of thermoelectric generator modules connected in one of series or in parallel.

7. The thermoelectric generator system of claim 1, further comprising a first plate having a first surface in contact with the heat source and an opposing second surface, the first material is in contact with the second surface in an engaged mode and retracted from the second surface by the passive actuator in a disengaged mode.

8. The thermoelectric generator system of claim 7, wherein the first plate includes a projection having a first sloped surface and the first material is disposed in a container having a mating second sloped surface, wherein the first and second sloped surfaces are in contact with each other in the engaged mode and the container is moved by the actuator to create a gap between the first and second sloped surfaces in the disengaged mode.

9. The thermoelectric generator system of claim 1, wherein the first material is encased on one or more sealed containers.

10. The thermoelectric generator system of claim 9, wherein the one or more sealed containers comprises a plurality of sealed containers and the actuator comprises a plurality of actuators respectively corresponding to the plurality of sealed containers.

11. The thermoelectric generator system of claim 9, wherein the sealed containers having a casing for holding the first material, wherein the casing is formed of a material having a higher melting temperature than the first material.

12. The thermoelectric generator system of claim 11, wherein the first material is an aluminum alloy and the material of the casing is stainless steel.

* * * * *